United States Patent
Suwa et al.

(10) Patent No.: US 9,326,425 B2
(45) Date of Patent: Apr. 26, 2016

(54) POWER MODULE

(75) Inventors: Tokihito Suwa, Hitachinaka (JP); Yujiro Kaneko, Hitachinaka (JP); Masashi Yura, Hitachinaka (JP); Nobutake Tsuyuno, Tokai (JP); Toshiaki Ishii, Hitachi (JP); Junpei Kusukawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 457 days.

(21) Appl. No.: 13/996,640

(22) PCT Filed: Dec. 7, 2011

(86) PCT No.: PCT/JP2011/078329
§ 371 (c)(1),
(2), (4) Date: Jun. 21, 2013

(87) PCT Pub. No.: WO2012/086417
PCT Pub. Date: Jun. 28, 2012

(65) Prior Publication Data
US 2013/0279230 A1    Oct. 24, 2013

(30) Foreign Application Priority Data
Dec. 24, 2010   (JP) .................................. 2010-288240

(51) Int. Cl.
*H05K 7/02* (2006.01)
*H05K 7/20* (2006.01)
(Continued)

(52) U.S. Cl.
CPC ........ *H05K 7/20509* (2013.01); *H01L 23/4334* (2013.01); *H01L 23/473* (2013.01); *H01L 25/16* (2013.01); *H01L 25/18* (2013.01); *H02M 7/003* (2013.01); *H05K 7/209* (2013.01);
(Continued)

(58) Field of Classification Search
None
See application file for complete search history.

(56) References Cited

U.S. PATENT DOCUMENTS

2011/0299265 A1   12/2011   Nakatsu et al.
2012/0087095 A1   4/2012   Tokuyama et al.

FOREIGN PATENT DOCUMENTS

CH    10117775 A1 * 10/2002  .......... H01L 21/4803
JP    10-107174 A    4/1998
(Continued)

OTHER PUBLICATIONS

International Preliminary Report on Patentability, WO 2012086417.*

(Continued)

*Primary Examiner* — Charles Garber
*Assistant Examiner* — Alia Sabur
(74) *Attorney, Agent, or Firm* — Crowell & Moring LLP

(57) ABSTRACT

Provided is a power conversion device including an insulating member manufactured such that a thickness di (mm) of the insulating member made from a resin, provided between a heat dissipating surface of a conductor plate bonded to a power semiconductor device and a heat dissipating plate that dissipates the heat of the power semiconductor device satisfies a relation of $di > (1.36 \times 10^{-8} \times Vt^2 + 3.4 \times 10^{-5} \times Vt - 0.015) \times \varepsilon r$, where a relative permittivity of the insulating member is $\varepsilon r$ and a surge voltage generated between the conductor plate and the heat dissipating plate accompanied by an ON/OFF switching operation of the power semiconductor device is Vt (V). The conductor plate of the power semiconductor device, the insulating member, and the heat dissipating plate are bonded by thermocompression bonding.

12 Claims, 13 Drawing Sheets

(51) Int. Cl.
*H01L 23/433* (2006.01)
*H01L 25/16* (2006.01)
*H02M 7/00* (2006.01)
*H01L 23/473* (2006.01)
*H01L 25/18* (2006.01)
*H01L 23/36* (2006.01)
*H01L 25/11* (2006.01)
*H01L 23/367* (2006.01)

(52) U.S. Cl.
CPC ............ *H05K7/20927* (2013.01); *H01L 23/36* (2013.01); *H01L 23/3677* (2013.01); *H01L 25/115* (2013.01); *H01L 2224/32245* (2013.01); *H01L 2924/1305* (2013.01); *H01L 2924/13055* (2013.01); *H01L 2924/13091* (2013.01)

(56) References Cited

FOREIGN PATENT DOCUMENTS

| | | |
|---|---|---|
| JP | 2009-147062 A | 7/2009 |
| JP | 2010-110143 A | 5/2010 |
| JP | 2010-258315 A | 11/2010 |

OTHER PUBLICATIONS

International Search Report dated Mar. 13, 2012 with English translation (Two (2) pages).

* cited by examiner

POWER MODULE

TECHNICAL FIELD

The present invention relates to a power module.

BACKGROUND ART

In recent years, for the consideration of the environment, hybrid vehicles (hereinafter referred to as "HEVs") that are driven by an engine and a motor and electric vehicles (hereinafter referred to as "EVs") that are driven by a motor only are widespread.

These HEVs and EVs have a power conversion device mounted thereon that converts DC power from a secondary battery into AC power to drive a motor during driving of vehicles and converts AC power regenerated from braking energy by the motor into DC power to charge the secondary battery during deceleration. The power conversion device includes a power module having a power semiconductor device and DC power and AC power are converted according to an ON/OFF operation of the power semiconductor device. Since the power conversion device mounted on HEVs and EVs is mounted in a limited mounting space, there is a demand for reducing the size and improving the efficiency.

Thus, it is effective to improve the cooling efficiency of the power module, and PTL 1 discloses a power module in which heat generated by a power semiconductor device is dissipated from both surfaces of the power module to reduce thermal resistance between the power semiconductor device and refrigerant that cools the power semiconductor device.

In such a power module, since the power semiconductor device needs to be electrically isolated from a housing (heat dissipating casing) of the power module storing the power semiconductor device, an insulating layer is formed between the power semiconductor device and the heat dissipating casing.

Since the power module repeatedly enters into a high-temperature state due to the heat generated by the power semiconductor device in operation and a low-temperature state in the stop state, the insulating layer is likely to be separated. When the insulating layer is separated, a discharge is more likely to occur through the gap formed by the separation. Although the insulating layer needs to be sufficiently thick in order to secure insulating properties even when the insulating layer is separated, the thicker the insulating layer, the higher the thermal resistance becomes.

The required thickness of the insulating layer needs to be determined by taking bubbles inside the insulating layer, the withstanding voltage when separated as above, and the properties and insulating properties of the insulating layer under various environmental conditions (temperature, humidity, atmospheric pressure, and the like) as well as the permittivity and withstanding voltage of the insulating layer into consideration. Thus, conventionally, the insulating layer thickness is determined by conducting a number of heat load cycle tests and dielectric withstand tests on experimentally manufactured power modules for a long period.

CITATION LIST

Patent Literature

PTL 1: Japanese Patent Application Laid-Open No. 2010-110143

SUMMARY OF INVENTION

Technical Problem

In the conventional power module, the method of determining the insulating layer thickness is not clear, and the thickness is determined through repeated experiences and experimental manufacturing. Therefore, it needs some time until design standards are confirmed.

Solution to Problem

According to a first aspect of the present invention, there is provided a power module comprising: a power semiconductor device; a first conductive member that is fixed to the power semiconductor device by a metal bonding member; and a second conductive member that is bonded to the first conductive member by an insulating sheet made from a resin, the insulating sheet being bonded to the first and second conductive members by thermo-compression bonding, wherein when a thickness of the insulating sheet is di (mm), a relative permittivity of the insulating sheet is ∈r(-), and a surge voltage generated between the conductive members is Vt (V), di and ∈r are set for Vt so as to satisfy a relation of $di > (1.36 \times 10^{-8} \times Vt^2 + 3.4 \times 10^{-5} \times Vt - 0.015) \times \epsilon r$, and when an insulating layer and an air layer are present in series in an equivalent circuit between the first and second conductive members, a discharge is suppressed.

According to a second aspect of the present invention, there is provided a power module comprising: a power semiconductor device; a first conductive member that is fixed to the power semiconductor device by a metal bonding member; and a second conductive member that is bonded to the first conductive member by an insulating sheet made from a resin, the insulating sheet being bonded to the first and second conductive members by thermo-compression bonding, wherein when a thickness of the insulating sheet is di (mm), a relative permittivity of the insulating sheet is ∈r(-), a surge voltage generated between the conductive members is Vt (V), and a lowest atmospheric pressure to which the power module is exposed is p (atm), di and ∈r are set so as to satisfy a relation of $di > (1.36 \times 10^{-8} \times Vt^2 + 3.4 \times 10^{-5} \times Vt - 0.015) \times \epsilon r / p$, and when an insulating layer and an air layer are present in series in an equivalent circuit between the first and second conductive members, a discharge is suppressed.

According to a third aspect of the present invention, there is provided a power module comprising: a power semiconductor device; a first conductive member that is fixed to the power semiconductor device by a metal bonding member; and a second conductive member that is bonded to the first conductive member by an insulating sheet made from a resin, the insulating sheet being bonded to the first and second conductive members by thermo-compression bonding, wherein when a thickness of the insulating sheet is di (mm), a relative permittivity of the insulating sheet is ∈r(-), a surge voltage generated between the conductive members is Vt (V), and an allowable thickness of any one of voids present in an interface between the insulating sheet and the conductive member and voids included in the insulating sheet is db (mm), di and ∈r are set so as to satisfy a relation of $di > (1.36 \times 10^{-8} \times Vt^2 + 3.4 \times 10^{-5} \times Vt - 0.015) \times \epsilon r + db$, and when an insulating layer and an air layer are present in series in an equivalent circuit between the first and second conductive members, a discharge is suppressed.

According to a fourth aspect of the present invention, there is provided a power module comprising: a power semiconductor device; a first conductive member that is fixed to the power semiconductor device by a metal bonding member; and a second conductive member that is bonded to the first conductive member by an insulating sheet made from a resin, the insulating sheet being bonded to the first and second conductive members by thermo-compression bonding, wherein when a thickness of the insulating sheet is di (mm), a relative permittivity of the insulating sheet is ∈r(−), a surge voltage generated between the conductive members is Vt (V), an allowable thickness of any one of voids present in an interface between the insulating sheet and the conductive member and voids included in the insulating sheet is db (mm), and a lowest atmospheric pressure to which the power module is exposed is p (atm), di and ∈r are set so as to satisfy a relation of di>$((1.36×10^{-8}×Vt^2+3.4×10^{-5}×Vt-0.015)×∈r+db)/p$, and when an insulating layer and an air layer are present in series in an equivalent circuit between the first and second conductive members, a discharge is suppressed.

According to a fifth aspect of the present invention, in the power module according to any one of the first to fourth aspects, it is preferable that when a dielectric withstanding voltage of the insulating sheet is Vbd (V/mm), and a withstanding voltage required between the first and second conductive members is Viso (V), a relation of di>Viso/Vbd is further satisfied.

According to a sixth aspect of the present invention, in the power module according to any one of the first to fifth aspects, the power semiconductor device includes a first principal surface and a second principal surface that face each other, at least a first principal electrode and a plurality of control terminals are formed on the first principal surface, and a second principal electrode is formed on the second principal surface, the first conductive member is a first conductor plate that is electrically connected to the second principal electrode of the power semiconductor device by a metal bonding member, the power semiconductor device and the conductor plate are sealed by an insulating resin so that at least a portion of a surface opposite to a surface of the first conductor plate to which the power semiconductor device is bonded is exposed as a heat dissipating surface, and the second conductive member is a first heat dissipating plate that is thermocompression-bonded to the heat dissipating surface by the insulating sheet.

According to a seventh aspect of the present invention, in the power module according to the sixth aspect, the second conductor plate is electrically connected to the first principal electrode of the power semiconductor device by the metal bonding member, the power semiconductor device and the second conductor plate are sealed by the insulating resin together with the first conductor plate so that at least a portion of a surface opposite to a surface of the second conductor plate to which the power semiconductor device is bonded is exposed as a second heat dissipating surface of the second conductor plate, and the second heat dissipating plate is bonded to the second heat dissipating surface of the second conductor plate by an insulating sheet made from a resin, and the insulating sheet is thermocompression-bonded and has a thickness and a relative permittivity that are defined to be the same as those of the insulating sheet between the first heat dissipating plate and the first conductor plate.

According to an eighth aspect of the present invention, in the power module according to the sixth or seventh aspect, it is preferable that when a thermal resistance of the power module is Rt (K/W), a thermal conductivity of the insulating sheet is λi (W/mK), and a size of the insulating sheet is Si (m$^2$), a relation of di≤Rt×0.3×λi×Si×1000 is further satisfied.

According to a ninth aspect of the present invention, in the power module according to the second aspect, the thickness di of the insulating sheet is set such that the lowest atmospheric pressure p (atm) is calculated as p=0.54 atm at an elevation of 4500 m, whereby a discharge between the first and second conductive members is suppressed.

According to a tenth aspect of the present invention, in the power module according to the fourth aspect, the thickness di of the insulating sheet is set such that the lowest atmospheric pressure p (atm) is calculated as p=0.54 atm at an elevation of 4500 m, whereby a discharge between the first and second conductive members is suppressed.

According to an eleventh aspect of the present invention, there is provided a power conversion device for converting a DC power into an AC power, comprising an inverter on which the power module according to any one of the first to tenth aspects is mounted.

Advantageous Effects of Invention

The use of the insulating structure according to the present invention makes it easy to determine the thickness of the insulating layer between the power semiconductor device of the power module and a heat dissipating casing and enables designing of the power module to be finished in a short period.

BRIEF DESCRIPTION OF DRAWINGS

FIG. 5 is a diagram illustrating the power module 300U when a screw 309 and a second sealing resin 351 are removed from the state illustrated in FIG. 4, in which
FIG. 5(a) is a perspective view,
FIG. 5(b) is a cross-sectional view when cut along the cross-section D and seen from the direction E similarly to FIG. 4(b),
and FIG. 5(c) is a cross-sectional view before pins 305 of the power module 300U are pressed and deformed.
FIG. 6 is a diagram illustrating the power module 300U when a module casing 304 is further removed from the state illustrated in FIG. 5, in which
FIG. 6(a) is a perspective view and FIG. 6(b) is a cross-sectional view when cut along the cross-section D and seen from the direction E similarly to FIGS. 4(b) and 5(b).
FIG. 10 is a diagram illustrating an electrical equivalent circuit when a conductor plate and a heat dissipating plate are insulated by an insulating member, and a gap is formed between the insulating member and the heat dissipating plate, in which
FIG. 10(a) is an equivalent electrical circuit corresponding to a schematic insulating structure illustrated in FIG. 10(b).

FIG. 13(b) is an assembly diagram illustrating attachment of a power module, a capacitor, and connecting electrode portions (busbars or the like), and FIG. 13(c) is an overview diagram of the power conversion device after assembly.

DESCRIPTION OF EMBODIMENTS

A power module according to the present invention has the same structure as the power module disclosed in PTL 1. In the following description, first of all, an overview of the structure of a power module according to the present invention and insulation and cooling of the power module when the power module according to the present invention is applied to HEVs will be described (FIGS. 1 to 7). After that, the structure of the power module according to the present invention will be described by way of embodiments of the present invention with reference to FIGS. 8 to 12. Finally, evaluation results of a power conversion device (FIG. 13) manufactured using the power module according to the present invention will be described.

Figure 1:
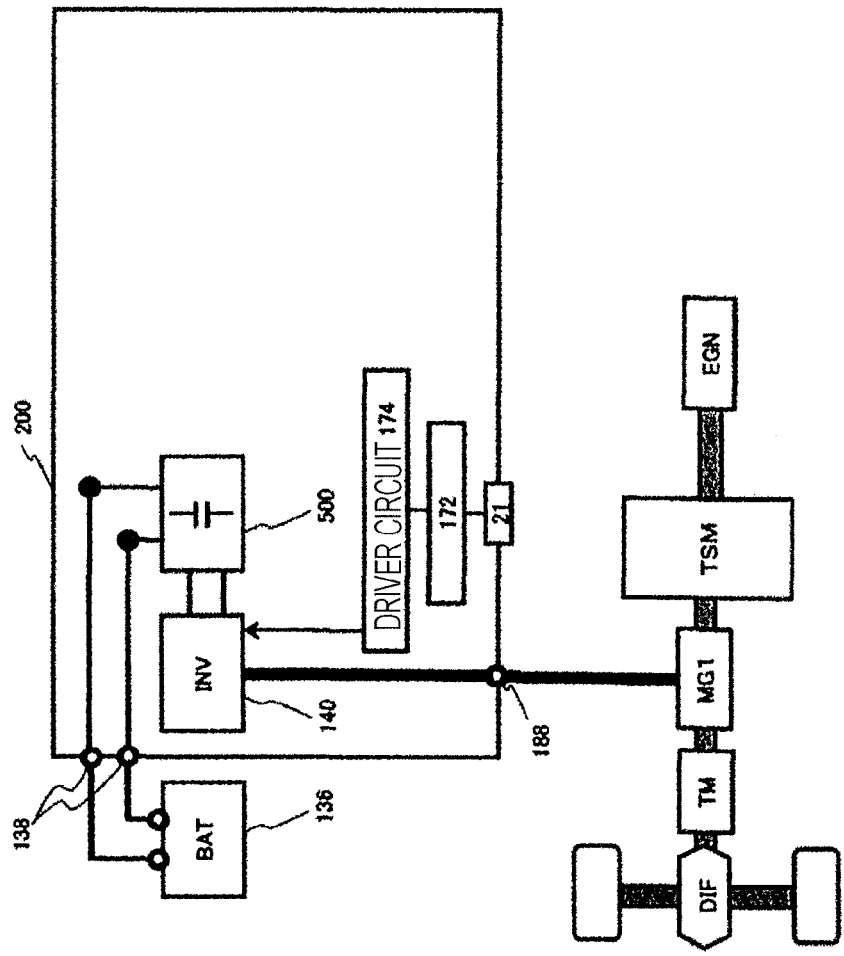
FIG. 1 is a diagram illustrating control blocks of an HEV.

FIG. 1 is a diagram illustrating control blocks of an HEV. An engine EGN and a motor generator MG1 generate a travel torque of a vehicle. Moreover, the motor generator MG1 has a function of converting mechanical energy externally applied to the motor generator MG1 into power as well as generating rotation torque.

The motor generator MG1 is a synchronous machine or an induction machine, for example, and operates as a motor and a power generator depending on a driving method as described above. When the motor generator MG1 is mounted on a vehicle, it is desirable for the motor generator to be compact and to provide high output power, and a permanent magnet-type synchronous electric motor that uses magnets such as neodymium is ideal as the motor generator. Moreover, a permanent magnet-type synchronous electric motor generates less heat from rotors than an inductive electric motor and is excellent for vehicle use from this perspective.

The output torque at the output side of the engine EGN is transmitted to the motor generator MG1 via a power distributing mechanism TSM, and rotation torque from the power distributing mechanism TSM or rotation torque generated by the motor generator MG1 is transmitted to wheels via a transmission TM and a differential gear DIF. On the other hand, when a vehicle is driven in a regenerative braking mode, rotation torque is transmitted from the wheels to the motor generator MG1, and AC power is generated based on the supplied rotation torque. The generated AC power is converted into DC power by a power conversion device 200 as described later to charge a high-voltage batter 136, and the charged power is used as travel energy again.

Configuration and Operation of Inverter Circuit

Figure 2:
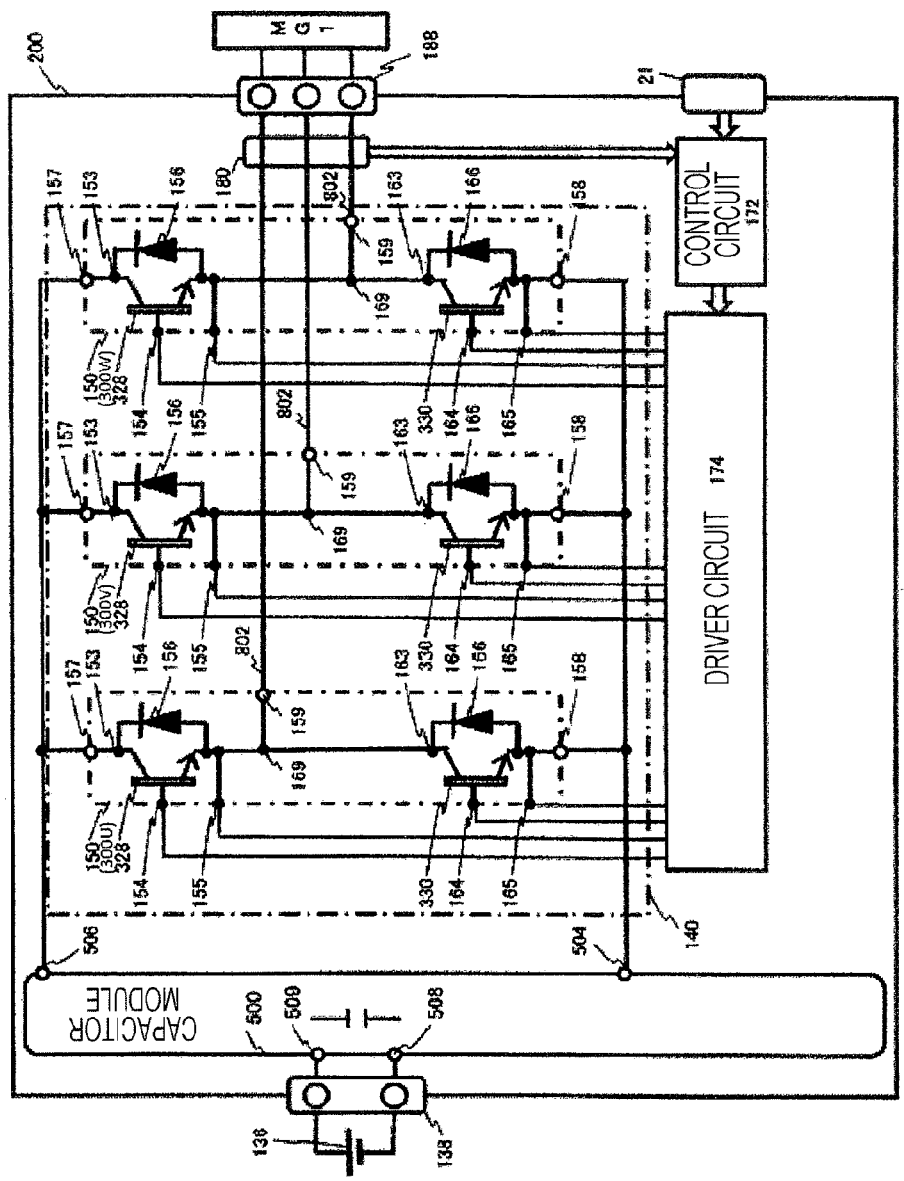
FIG. 2 is a schematic view of an inverter circuit 140.
Figure 3:
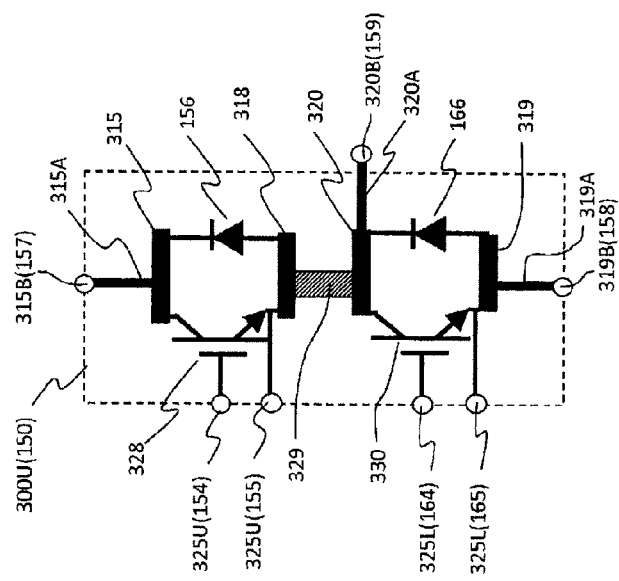
FIG. 3 is a schematic circuit diagram illustrating details of the inverter circuit 140 for one phase (see reference numeral 150 (300U) in FIG. 1), that is one power module (300U), illustrating an arrangement of a power semiconductor devices IGBTs 328 and 330, diodes 156 and 166, and a conductor plate.

FIG. 2 illustrates a circuit block diagram of the power conversion device 200 used in the HEV illustrated in FIG. 1. FIG. 3 illustrates the configuration of a series circuit 150 (that is, a circuit of one power module according to an embodiment of the present invention) for one phase of a 3-phase inverter circuit 140 illustrated in FIG. 2 and illustrates the correspondence between reference numerals of the components illustrated in the mechanical structure diagrams of the power module illustrated in FIGS. 4 to 8.

The inverter circuit 140 is electrically connected to a battery 136 via a DC connector 138, and power is exchanged between the battery 136 and the inverter circuit 140. When the motor generator MG1 operates as a motor, the inverter circuit 140 generates AC power based on the DC power supplied from the battery 136 via the DC connector 138 and supplies the AC power to the motor generator MG1 via an AC connector 188.

Although not illustrated in FIG. 1, the battery 136 is also used as a power supply for driving a motor for auxiliary machines. The motor for auxiliary machines may be a motor for driving an air-conditioning compressor or a motor for driving a hydraulic pump for control. The DC power from the battery 136 is supplied to a power module for auxiliary machines, and the power module for auxiliary machines generates AC power and supplies the same to a motor for auxiliary machines. The power module for auxiliary machines basically has the same circuit configuration and function as those of the inverter circuit 140 and controls the phase, frequency, and power of the AC power supplied to the motor for auxiliary machines. The power conversion device 200 includes a capacitor module 500 for smoothing the DC power supplied to the inverter circuit 140.

The power conversion device 200 includes a communication connector 21 for receiving a command from a higher-level controller or transmitting data that indicates states to the higher-level controller. The power conversion device 200 computes a control amount of the motor generator MG1 with the aid of a control circuit 172 based on the command input from the connector 21, further computes whether it will operate as a motor or a power generator, generates control pulses based on the computation results, and supplies the control pulses to a driver circuit 174. The driver circuit 174 generates driving pulses for controlling the inverter circuit 140 based on the supplied control pulses.

Next, the configuration of an electrical circuit of the inverter circuit 140 will be described with reference to FIGS. 1 and 2. In the following description, insulated gate bipolar transistors (hereinafter referred to as "IGBTs") are used as power semiconductor devices, and a series circuit 150 of the upper and lower arms is formed by an IGBT 328 and a diode 156 that operate as the upper arm and an IGBT 330 and a diode 166 that operate as the lower arm. The inverter circuit 140 includes the series circuit 150 so as to correspond to the three U, V, and W phases of the AC power that is to be output.

In this embodiment, these three phases correspond to the respective coils of the three-phase armature coils of the motor generator MG1. The series circuit 150 of the upper and lower arms of each of the three phases outputs an AC current from an intermediate electrode 169 which is a midpoint portion of the series circuit. The intermediate electrode 169 is connected to an AC busbar 802 described later, which is an AC power line to the motor generator MG1, via an AC terminal 159 and an AC connector 188.

A collector electrode 153 of the IGBT 328 of the upper arm is electrically connected to a positive capacitor terminal 506 of the capacitor module 500 via a positive terminal 157. Moreover, an emitter electrode of the IGBT 330 of the lower arm is electrically connected to a negative capacitor terminal 504 of the capacitor module 500 via a negative terminal 158.

As described above, the control circuit 172 receives control commands from the higher-level controller via the connector 21, generates control pulses which are control signals for controlling the IGBTs 328 and 330 that constitute the upper or lower arm of the series circuit 150 of each phase, that constitutes the inverter circuit 140 based on the control commands, and supplies the control pulses to the driver circuit 174.

The driver circuit 174 supplies driving pulses for controlling the IGBTs 328 and 330 that constitute the upper or lower arm of the series circuit 150 of each phase to the IGBTs 328 and 330 of each phase based on the control pulses. The IGBTs 328 and 330 perform a conduction or interruption operation based on the driving pulses from the driver circuit 174, converts the DC power supplied from the battery 136 into 3-phase AC power, and supplies the converted power to the motor generator MG1.

The IGBT 328 includes a collector electrode 153, a signal emitter electrode 155, and a gate electrode 154. Moreover, the IGBT 330 includes a collector electrode 163, a signal emitter electrode 165, and a gate electrode 164. The diode 156 is electrically connected between the collector electrode 153 and the emitter electrode 155. Moreover, the diode 166 is electrically connected between the collector electrode 163 and the emitter electrode 165.

Metal oxide semiconductor field effect transistors (hereinafter abbreviated as MOSFETs) may be used as the power semiconductor devices, and in this case, the diodes 156 and 166 are not necessary. IGBTs are ideal when the DC voltage of the power semiconductor device is relatively high, and MOSFETs are ideal when the DC voltage of the power semiconductor device is relatively low.

The capacitor module 500 includes a positive capacitor terminal 506, a negative capacitor terminal 504, a positive power terminal 509, and a negative power terminal 508. High-voltage DC power from the battery 136 is supplied to the positive power terminal 509 and the negative power terminal 508 via the DC connector 138, and is also supplied to the inverter circuit 140 from the positive capacitor terminal 506 and the negative capacitor terminal 504 of the capacitor module 500.

On the other hand, the DC power converted from the AC power by the inverter circuit 140 is supplied from the positive capacitor terminal 506 and the negative capacitor terminal 504 to the capacitor module 500, and is also supplied to the battery 136 via the DC connector 138 from the positive power terminal 509 and the negative power terminal 508, and is then stored in the battery 136.

The control circuit 172 includes a micro-computer (hereinafter referred to as a "microcomputer") (not illustrated) for computing the switching timings of the IGBTs 328 and 330. Examples of information input to the microcomputer include a target torque value required for the motor generator MG1, a current value supplied from the series circuit 150 to the motor generator MG1, and a magnetic pole position of the rotor of the motor generator MG1.

The target torque value is based on a command signal output from a higher-level controller (not illustrated). The current value is detected based on a detection signal obtained by a current sensor. The magnetic pole position is detected based on a detection signal output from a rotating magnetic pole sensor (not illustrated) such as a resolver provided in the motor generator MG1. In this embodiment, although a case where the current sensor detects a 3-phase current value is described as an example, the current sensor may detect current values for two phases and compute current for three phases.

The microcomputer in the control circuit 172 computes current command values for the d and q-axes of the motor generator MG1 based on the target torque value, computes voltage command values for the d and q-axes based on the differences between the computed current command values for the d and q-axes and the detected current values for the d and q-axes, and converts the computed voltage command values for the d and q-axes into voltage command values for the U, V, and W-phases based on the detected magnetic pole positions. Moreover, the microcomputer generates a pulse-shaped modulation wave based on comparison between a fundamental wave (sinusoidal wave) and a carrier wave (triangular wave) based on the voltage command values for the U, V, and W-phases and outputs the generated modulation wave to the driver circuit 174 as a pulse-width modulation (PWM) signal.

When driving the lower arms, the driver circuit 174 outputs a drive signal obtained by amplifying the PWM signal to the gate electrodes of the IGBTs 330 of the corresponding lower arms. Moreover, when driving the upper arm, the driver circuit 174 amplifies the PWM signal after shifting the reference potential level of the PWM signal to the reference potential level of the upper arm and outputs the amplified PWM signal to the gate electrodes of the IGBTs 328 of the corresponding upper arms.

Information on the current flowing into the emitter electrodes of the IGBTs 328 and 330 is input to the driver circuit 174 from the signal emitter electrodes 155 and 165 of the respective arms. As a result, over-current is detected, and when over-current is detected, the switching operation of the IGBTs 328 and 330 is stopped, and the IGBTs are protected from over-current.

A temperature sensor (not illustrated) provided in the series circuit 150 outputs information on the temperature of the series circuit 150 to the microcomputer. Moreover, information on the DC positive-side voltage of the series circuit 150 is input to the microcomputer. The microcomputer performs over-temperature detection and over-voltage detection based on these items of information, and when over-temperature or over-voltage is detected, controls the driver circuit 174 to stop the switching operation of the IGBTs 328 and 330.

Structure and Properties of Power Module

Hereinafter, the structure of the power module according to the present invention will be described with reference to FIGS. 3 to 7. The order of FIGS. 4 to 7 is reverse to the practical order of assembling a power module. As illustrated in FIG. 3, the power module illustrated in FIGS. 4 to 7 is a portion corresponding to the series circuit 150 for one phase of the 3-phase inverter circuit 140. For example, the series circuit 150 on the leftmost side of the inverter circuit 140 illustrated in FIG. 2 corresponds to the series circuit 150 for one phase (U) of the three phases (U, V, and W), which also corresponds to the power module 300U as illustrated in FIG. 3.

Evaluation results on the insulation properties of a power module manufactured actually will be described subsequently to description of the structure of the power module.

FIG. 4(a) is a perspective view of the power module 300U according to this embodiment. FIG. 4(b) is a cross-sectional view of the power module 300U of FIG. 4(a) when cut along a cross-section D and seen from a direction E. The power module 300U corresponds to one phase (U) of the 3-phase inverter circuit 140 as described above, and the power modules (300V and 300W) corresponding to the other phases (V and W) have the same structure as the power module 300U.

Figure 4:
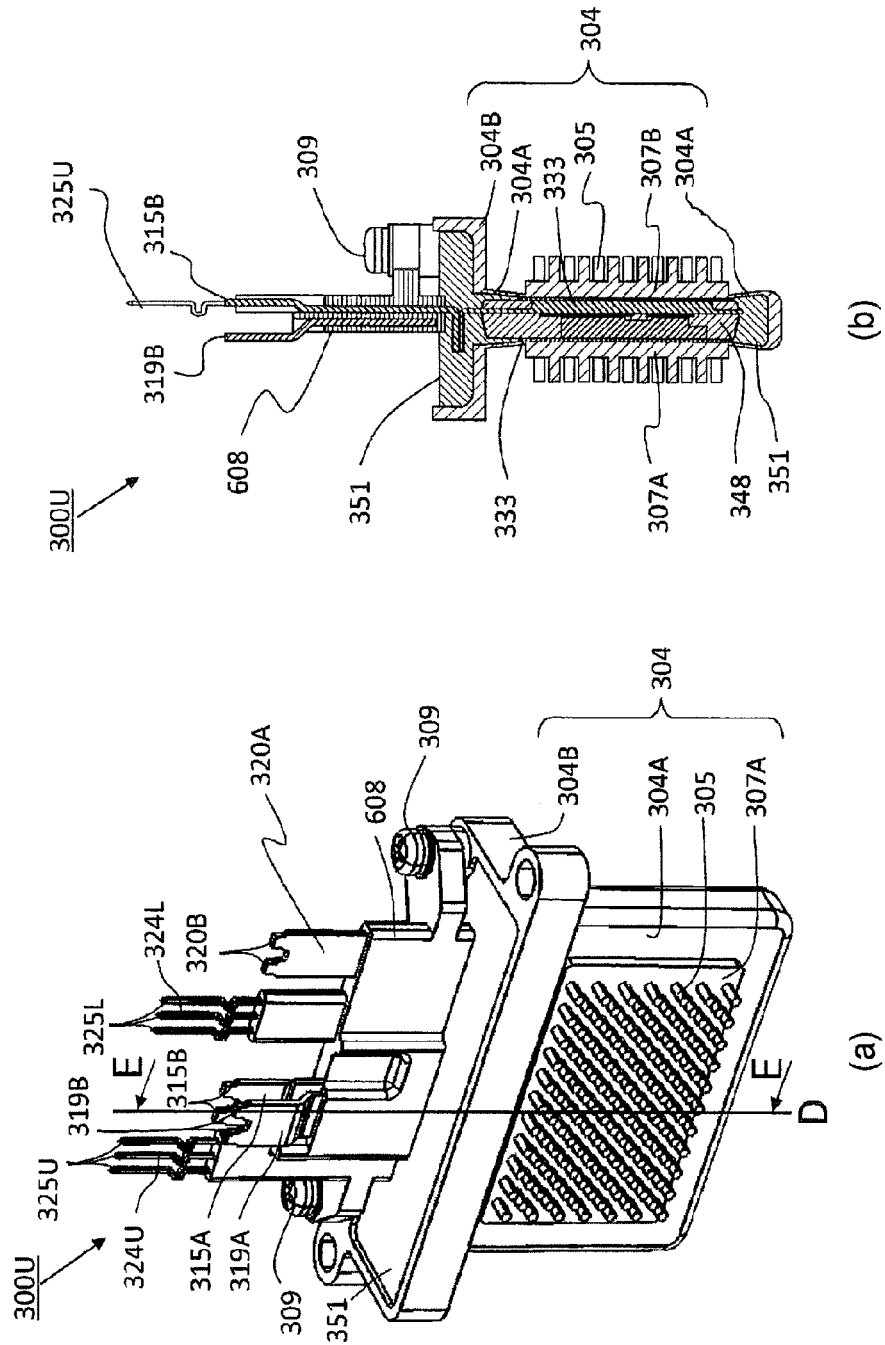
FIG. 4(a) is a perspective view of a power module 300U according to this embodiment.
FIG. 4(b) is a cross-sectional view of the power module 300U according to this embodiment when cut along the cross-section D and seen from the direction E.
Figure 5:
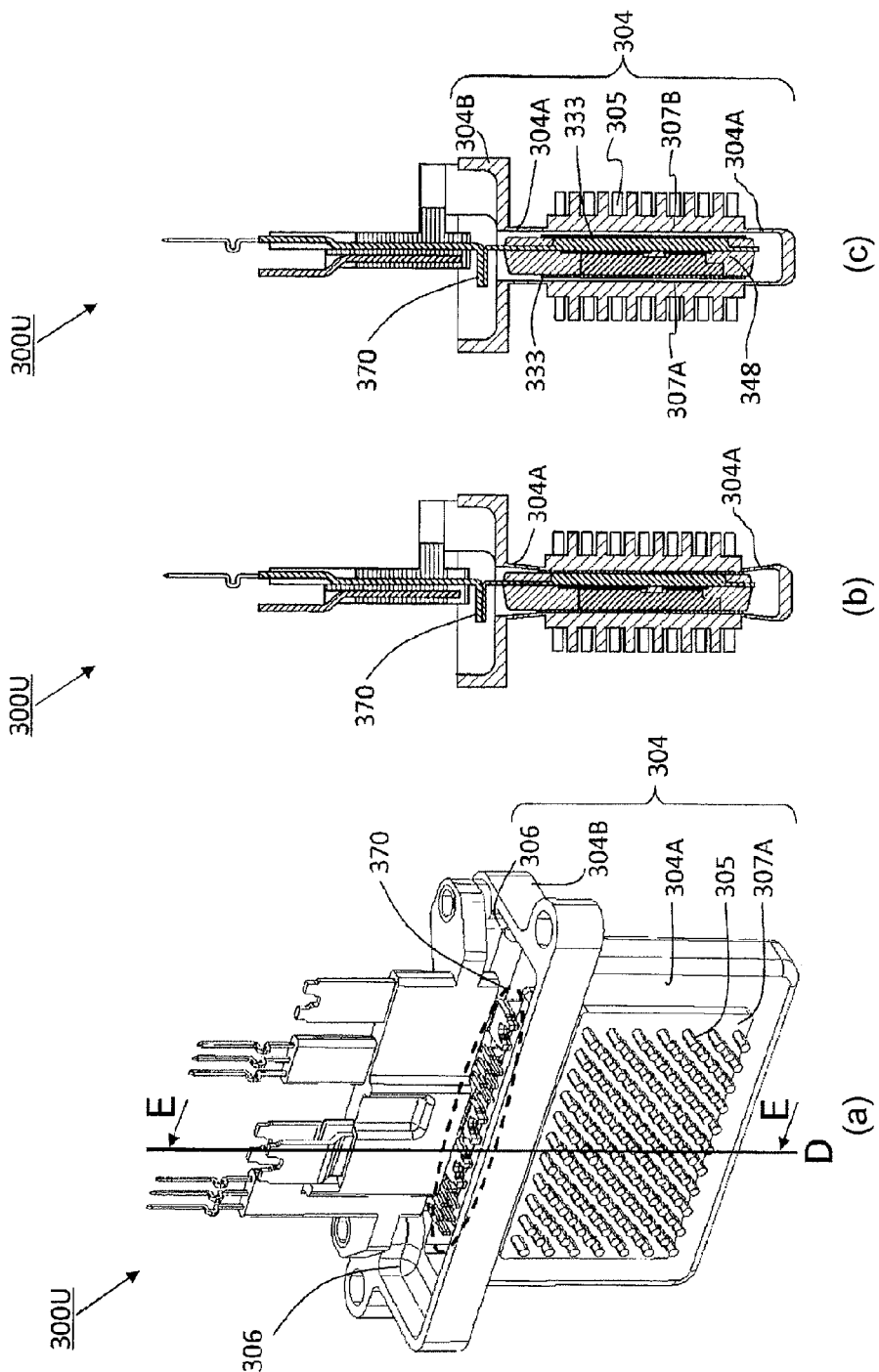

FIG. 5 is a diagram illustrating the power module 300U in which a screw 309 and a second sealing resin 351 are removed from the state illustrated in FIG. 4 for better understanding of the structure. FIG. 5(a) is a perspective view, and FIG. 5(b) is a cross-sectional view when cut along the cross-section D and seen from the direction E similarly to FIG. 4(b). Moreover, FIG. 5(c) illustrates a cross-sectional view before pins 305 are pressed and a curved portion 304A is deformed.

Figure 6:
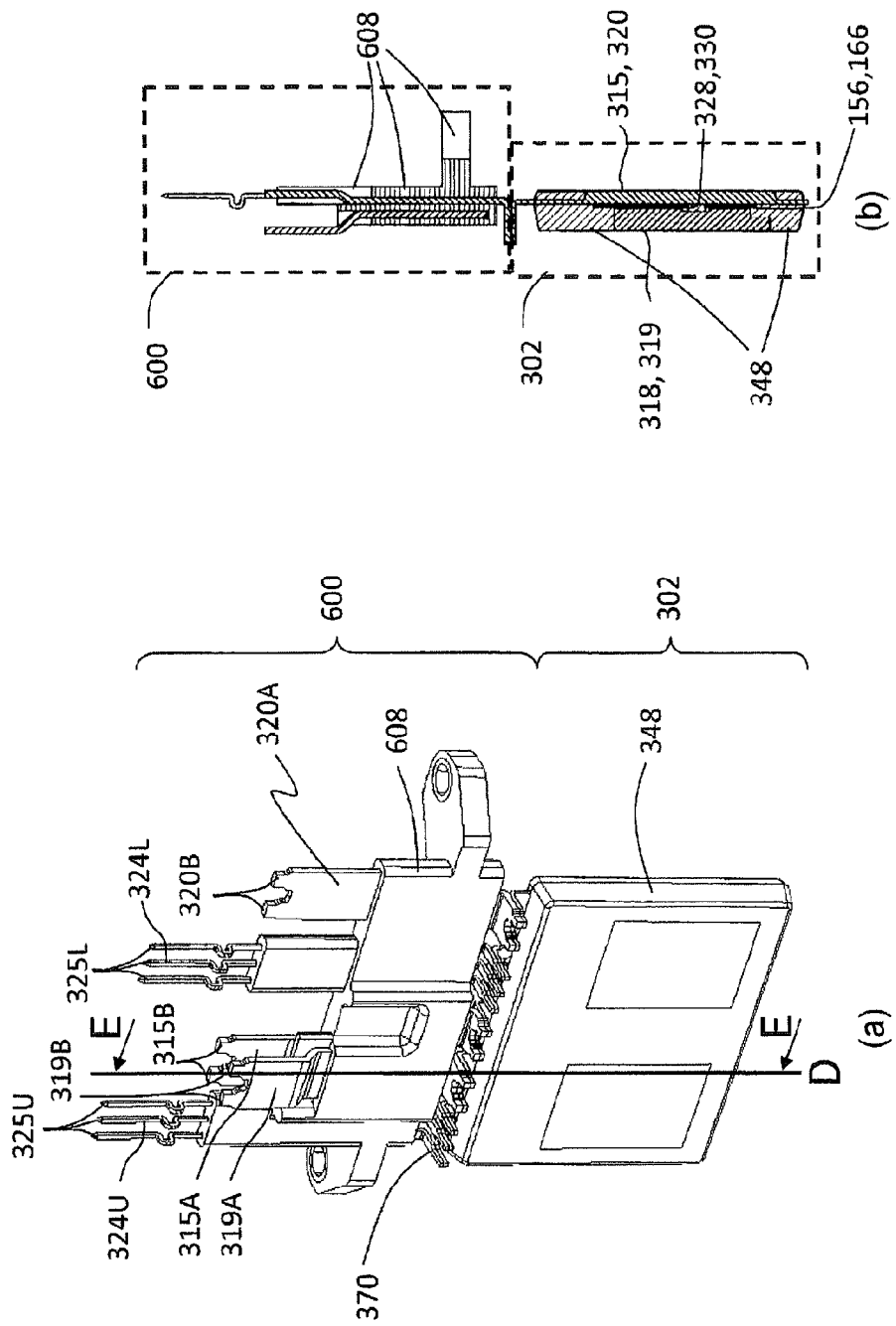

FIG. 6 is a diagram illustrating the power module 300U in which a module casing 304 is further removed from the state illustrated in FIG. 5. FIG. 6(a) is a perspective view, and FIG. 6(b) is a cross-sectional view when cut along the cross-section D and seen from the direction E similarly to FIGS. 4(b) and 5(b).

In assembling of the power module, the power module 300U in the state in the middle of assembling as illustrated in FIG. 6 is inserted in the module casing 304 together with an insulating sheet 333, pressure is applied to both sides in a portion of the module casing 304 where the heat dissipating pins 305 are formed, and conductor plates 318, 315, 319, and 320 are pressure-bonded to make close contact with the module casing 304 with the insulating sheet 333 interposed. As a result, the module casing 304 is deformed as illustrated in FIG. 4(a) or 5(b).

In pressure-bonding of the conductor plates 318, 315, 319, and 320, the insulating sheet 333, and the module casing 304, a vacuum is created in the module casing, and the above components are pressure-bonded while applying heat when pressure is applied from both sides of the module casing 304. With application of heat, the conductor plates and the power module casing are tightly bonded. Moreover, in this case, since a vacuum is created in the power module casing, bubbles (voids) are removed from the bonding portion between the conductor plates 318, 315, 319, and 320 including the insulating sheet 333 and the module casing 304.

Figure 7:
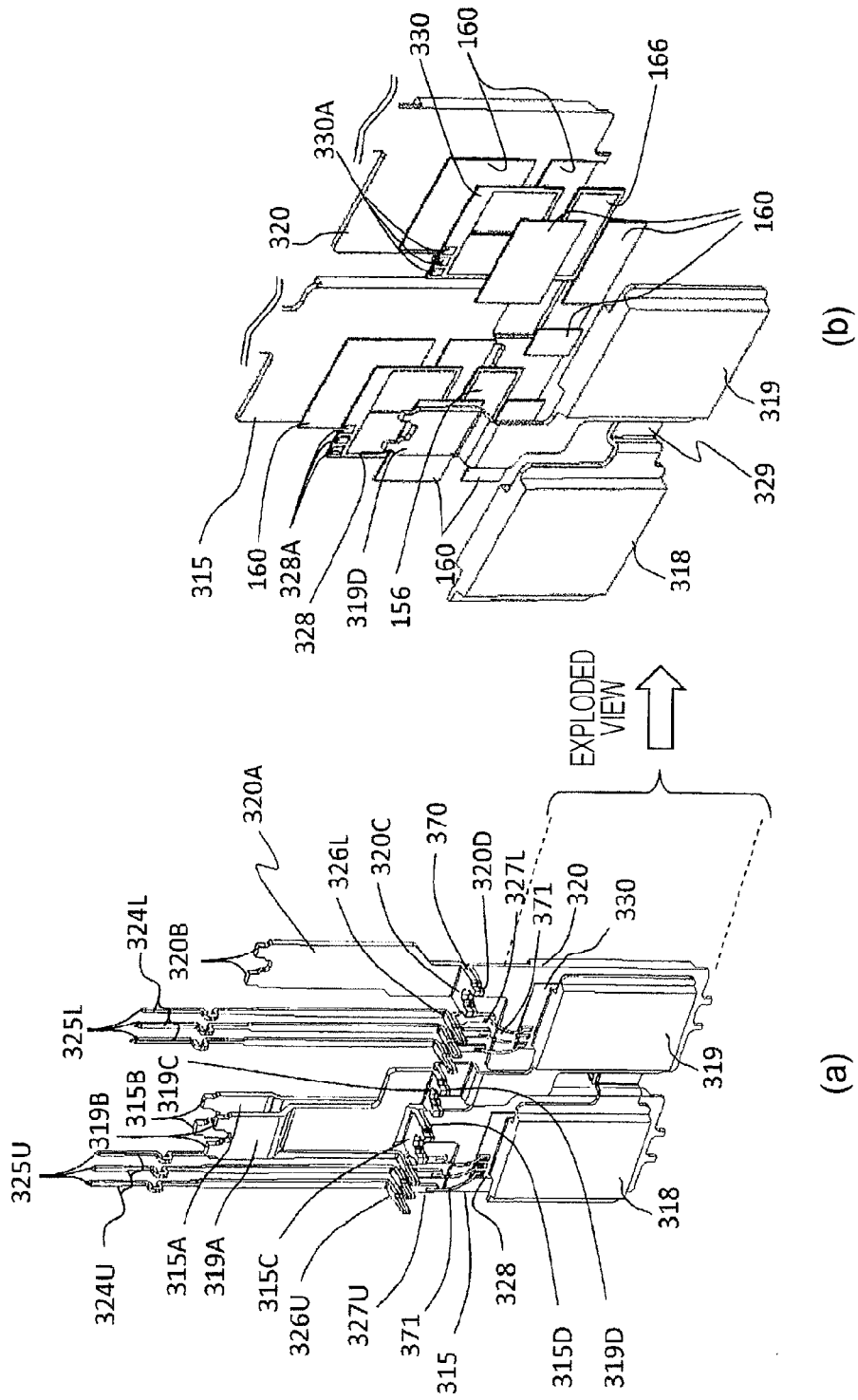
FIG. 7(a) is a perspective view of the power module 300U when a first sealing resin 348 and a wire insulating portion 608 are further removed from the state illustrated in FIG. 6.
FIG. 7(b) is a schematic view illustrating a stacked structure of the portion of the power module including power semiconductor devices IGBTs 328 and 330 and diodes 156 and 166.

FIG. 7 is a diagram illustrating the power module 300U in which a first sealing resin 348 and a wire insulating portion 608 are further removed from the state illustrated in FIG. 6. FIG. 7(a) is an entire perspective view, and FIG. 7(b) is an exploded view for better understanding of the structure in which the power semiconductor devices IGBTs 328 and 330 and the diodes 156 and 166 are connected to the conductor plates 315 and 318 and the conductor plates 320 and 319, respectively.

As illustrated in FIG. 7(b), the collector electrode of the upper arm IGBT 328 and the cathode electrode of the upper arm diode 156 are fixed to the conductor plate 315. The collector electrode of the lower arm IGBT 330 and the cathode electrode of the lower arm diode 166 are fixed to the conductor plate 320. The conductor plates 318 and 319 are disposed on the IGBTs 328 and 330 and the diodes 156 and 166 approximately on the same surface. The emitter electrode of the upper arm IGBT 328 and the anode electrode of the upper arm diode 156 are fixed to the conductor plate 318. The emitter electrode of the lower arm IGBT 330 and the anode electrode of the lower arm diode 166 are fixed to the conductor plate 319. The respective power semiconductor devices are fixed by a metal bonding member 160. The metal bonding member 160 is a soldering material, a silver sheet, and a low-temperature sintered bonding member including fine metal particles, for example.

The respective power semiconductor devices are planar flat structures, and the electrodes of the power semiconductor device are formed on the front and rear surfaces thereof. As illustrated in FIG. 7, the electrodes of the power semiconductor device are sandwiched between the conductor plates 315 and 318 or between the conductor plates 320 and 319. That is, the conductor plates 315 and 318 are stacked such that the conductor plates face approximately in parallel with the IGBT 328 and the diode 156 interposed. Similarly, the conductor plates 320 and 319 are stacked such that the conductor plates face approximately in parallel with the IGBT 330 and the diode 166 interposed. Moreover, the conductor plates 320 and 318 are connected by an intermediate electrode 329. With this connection, the upper arm circuit and the lower arm circuit are electrically connected to form the series circuit of the upper and lower arms.

As illustrated in FIGS. 6 and 7, the power semiconductor device (the IGBTs 328 and 330 and the diodes 156 and 166) that constitutes the series circuit 150 of the upper and lower arms of the power module 300U is fixed in such a manner that the series circuit 150 is sandwiched between the conductor plates 315 and 318 or between the conductor plates 320 and 319. The conductor plate 315 and the like are sealed by the first sealing resin 348 with the heat dissipating surface thereof being exposed, and the insulating sheet 333 is thermocompression-bonded to the heat dissipating surface. The first sealing resin 348 has a polyhedral shape (in this example, an approximately rectangular parallelepiped shape) as illustrated in FIG. 6.

A primary sealed module structure 302 (see FIG. 6) sealed by the first sealing resin 348 is inserted in the module casing 304 and is thermocompression-bonded to the inner surface of the module casing 304 which is a CAN-type cooler, with the insulating sheet 333 interposed. Here, the CAN-type cooler is a cooler having such a cylindrical shape that an insertion opening 306 is formed in one surface and that the other surface is the bottom. A second sealing resin 351 is filled in the voids that remain in the module casing 304.

The module casing 304 is formed of an electrically conductive member (for example, an aluminum alloy material (Al, AlSi, AlSiC, Al—C, or the like)) and is integrally molded in a seamless state. The module casing 304 has such a structure that no opening other than the insertion opening 306 is formed, and the circumference of the insertion opening 306 is surrounded by a flange 304B. Moreover, as illustrated in FIG. 4(a), a first heat dissipating surface 307A and a second heat dissipating surface 307B having a larger surface than other surfaces are disposed so as to face each other, and the power semiconductor devices (the IGBTs 328 and 330 and the diodes 156 and 166) are disposed so as to face these heat dissipating surfaces. Three surfaces connected to the first and second heat dissipating surfaces 307A and 307B that face each other form surfaces that are closed with a smaller width than the first and second heat dissipating surfaces 307A and 307B, and the insertion opening 306 is formed in the remaining one surface.

The shape of the module casing 304 does not need to be a perfect rectangular parallelepiped shape, and the corners may have a curved surface as illustrated in FIG. 4(a). Since the use of a metal casing having such a shape enables the flange 304B to secure refrigerant sealing properties even when the module casing 304 is inserted in the passage where refrigerant such as water or oil flows, it is possible to prevent the refrigerant from entering into the module casing 304 with a simple configuration. Moreover, the pins 305 are uniformly formed on the first and second heat dissipating surfaces 307A and 307B that face each other. Further, the curved portion 304A having an extremely small thickness is formed on the circumferences of the first and second heat dissipating surfaces 307A and 307B. Since the curved portion 304A can be made extremely thin to an extent that the curved portion is easily deformed by pressing the pins 305, productivity is improved after the primary sealed module structure 302 is inserted.

By bonding the conductor plates 315 and the like to the inner wall of the module casing 304 with the insulating sheet 333 interposed according to thermocompression bonding as described above, it is possible to decrease voids between the conductor plates 315 and the like and the inner wall of the module casing 304 and to effectively transmit heat generated by the power semiconductor devices to the pins 305. Further, by providing the insulating sheet 333 with a thickness and flexibility to some extent, generated thermal stress can be absorbed in the insulating sheet 333 and the insulating sheet 333 can be effectively used in power conversion devices for vehicles where a change in temperature is violent.

A DC positive wire 315A and a DC negative wire 319A made from metal are formed outside the module casing 304 so as to electrically connect to the capacitor module 500, and a DC positive terminal 315B (157) and a DC negative terminal 319B (158) are formed at the respective tip ends thereof. Moreover, an AC wire 320A made from metal is formed so as to supply AC power to the motor generator MG1, and an AC terminal 320B (159) is formed at a tip end thereof. In this embodiment, as illustrated in FIG. 7, the DC positive wire 315A is connected to the conductor plate 315, the DC negative wire 319A is connected to the conductor plate 319, and the AC wire 320A is connected to the conductor plate 320.

Further, signal wires 324U and 324L made from metal are formed outside the module casing 304 so as to electrically connect to the driver circuit 174, and signal terminals 325U (154, 155) and signal terminals 325L (164, 165) are formed at the respective tip ends thereof. In this embodiment, as illustrated in FIG. 7, the signal wire 324U is connected to the IGBT 328, and the signal wire 324L is connected to the IGBT 330.

The DC positive wire 315A, the DC negative wire 319A, the AC wire 320A, the signal wire 324U, and the signal wire 324L are integrally molded as an auxiliary molded structure 600 in a state where they are insulated from each other by a wire insulating portion 608 formed of a resin material. The wire insulating portion 608 functions also as a support member for supporting the respective wires, and a thermosetting resin or a thermoplastic resin having insulating properties is ideal as the resin material used therefor. Due to this, it is possible to secure insulating properties between the DC positive wire 315A, the DC negative wire 319A, the AC wire 320A, the signal wire 324U, and the signal wire 324L, and high-density wiring can be realized. The auxiliary molded structure 600 is metal-bonded to the primary sealed module structure 302 in a connecting portion 370, and is then fixed to the module casing 304 by the screw 309 that passes through a screw hole formed in the wire insulating portion 608. In metal bonding of the primary sealed module structure 302 and the auxiliary molded structure 600 in the connecting portion 370, TIG welding, resistance soldering, ultrasonic welding, and the like can be used, for example.

The DC positive wire 315A and the DC negative wire 319A have such a shape that the wires are stacked so as to face each other with the wire insulating portion 608 interposed and extend approximately in parallel. With such arrangement and shape, the currents that flow instantaneously during the switching operation of the power semiconductor device flow oppositely in reverse directions. Due to this, the effect of canceling magnetic fields that are created by the currents is obtained, which makes it possible to obtain low inductance. The AC wire 320A and the signal terminals 325U and 325L extend in the same direction as the DC positive wire 315A and the DC negative wire 319A.

The connecting portion 370 in which the primary sealed module structure 302 and the auxiliary molded structure 600 are connected by metal bonding is sealed in the module casing 304 by the second sealing resin 351. Due to this, since it is possible to stably secure an insulation distance necessary between the connecting portion 370 and the module casing 304, it is possible to reduce the size of the power module 300U as compared to the case in which the connecting portion 370 is not sealed.

As illustrated in FIG. 7(a), on the side of the connecting portion 370 closer to the auxiliary molded structure 600, an auxiliary molded structure-side DC positive connection terminal 315C, an auxiliary molded structure-side DC negative connection terminal 319C, an auxiliary molded structure-side AC connection terminal 320C, an auxiliary molded structure-side signal connection terminal 326U, and an auxiliary molded structure-side signal connection terminal 326L are arrayed in a line. On the other hand, on the side of the connecting portion 370 closer to the primary sealed module structure 302, a device-side DC positive connection terminal 315D, a device-side DC negative connection terminal 319D, a device-side AC connection terminal 320D, a device-side signal connection terminal 327U, and a device-side signal connection terminal 327L are arrayed in a line along one surface of the first sealing resin 348 having a polyhedral shape. With such a structure in which respective terminals of the connecting portion 370 are arrayed in a line, it becomes easy to manufacture the primary sealed module structure 302 according to transfer molding.

Here, the positional relation between the respective terminals when each of the same kinds of portions extended outward from the first sealing resin 348 of the primary sealed module structure 302 is regarded as one terminal will be described. In the following description, a terminal including the DC positive wire 315A (including the DC positive terminal 315B and the auxiliary molded structure-side DC positive connection terminal 315C) and the device-side DC positive connection terminal 315D will be referred to as a positive-side terminal. A terminal including the DC negative wire 319A (including the DC negative terminal 319B and the auxiliary molded structure-side DC negative connection terminal 319C) and the device-side DC negative connection terminal 315D will be referred to as a negative-side terminal. A terminal including the AC wire 320A (including the AC terminal 320B and the auxiliary molded structure-side AC connection terminal 320C) and the device-side AC connection terminal 320D will be referred to as an output terminal. A terminal including the signal wire 324U (including the signal terminal 325U and the auxiliary molded structure-side signal connection terminal 326U) and the device-side signal connection terminal 327U will be referred to as an upper arm signal terminal. A terminal including the signal wire 324L (including the signal terminal 325L and the auxiliary molded structure-side signal connection terminal 326L) and the device-side signal connection terminal 327L will be referred to as a lower arm signal terminal.

All of the respective terminals protrude through the connecting portion 370 from the first and second sealing resins 348 and 351, and the respective portions (the device-side DC positive connection terminal 315D, the device-side DC negative connection terminal 319D, the device-side AC connection terminal 320D, the device-side signal connection terminal 327U, and the device-side signal connection terminal 327L) protruding from the first sealing resin 348 are arrayed in a line along one surface of the first sealing resin 348 having the above-described polyhedral shape. Moreover, the positive-side terminal and the negative-side terminal protrude from the second sealing resin 351 in a stacked state and extend to the outside of the module casing 304. With such a configuration, during the mold closing when the power semiconductor device is sealed by the first sealing resin 348 to manufacture the primary sealed module structure 302, it is possible to prevent excessively large stress from being applied to the connecting portion between the power semiconductor device and the terminals and to prevent a gap from being formed in the mold. Further, since magnetic fluxes that cancel each other are generated by the currents flowing in opposite directions through the stacked positive and negative-side terminals, it is possible to obtain low inductance.

On the side of the auxiliary molded structure 600, the auxiliary molded structure-side DC positive connection terminal 315C and the auxiliary molded structure-side DC negative connection terminal 319C are respectively formed at the tip ends of the DC positive wire 315A and the DC negative wire 319A on the side opposite to the DC positive terminal 315B and the DC negative terminal 319B. Moreover, the auxiliary molded structure-side AC connection terminal 320C is formed at the tip end of the AC wire 320A on the side opposite to the AC terminal 320B. The auxiliary molded structure-side signal connection terminals 326U and 326L are respectively formed at the tip ends of the signal wires 324U and 324L on the side opposite to the signal terminals 325U and 325L.

On the other hand, on the side of the primary sealed module structure 302, the device-side DC positive connection terminal 315D, the device-side DC negative connection terminal 319D, and the device-side AC connection terminal 320D are respectively formed on the conductor plates 315, 319, and 320. Moreover, the device-side signal connection terminals 327U and 327L are respectively connected to the IGBTs 328 and 330 by bonding wires 371.

Structure and Thermal Conduction of Power Module

The power module according to the present invention has the same structure as the power module disclosed in PTL 1.

FIG. 8(b) schematically illustrates a portion of the power module 300U of FIG. 8(a) including the power semiconductor device IGBT 328 or 330 at an enlarged scale. The portions including the diodes 156 and 166 also have the same structure as that disclosed in PTL 1.

The conductor plates (315, 318, 319, and 320) are bonded to both surfaces of the power semiconductor device with a soldering layer (160) interposed. As illustrated in FIG. 6, the conductor plates are sealed by the first sealing resin in a state where the outer surfaces are exposed. Further, a semiconductor circuit portion is accommodated in the module casing (the first and second heat dissipating surfaces 307A and 307B) and is supported by being sandwiched between the inner walls of the module casing 304 with the insulating member (the insulating sheet 333) made from a resin interposed. As described in FIG. 5, in order to closely adhere the power semiconductor device and the heat dissipating plate, the insulating member is thermally hardened after pressing the pins 305 from the outside to elastically deform the curved portion 304A of the module casing 304. Further, an inorganic filler having satisfactory thermal conductivity is filled in the insulating member in order to obtain satisfactory heat dissipating properties.

Figure 13:
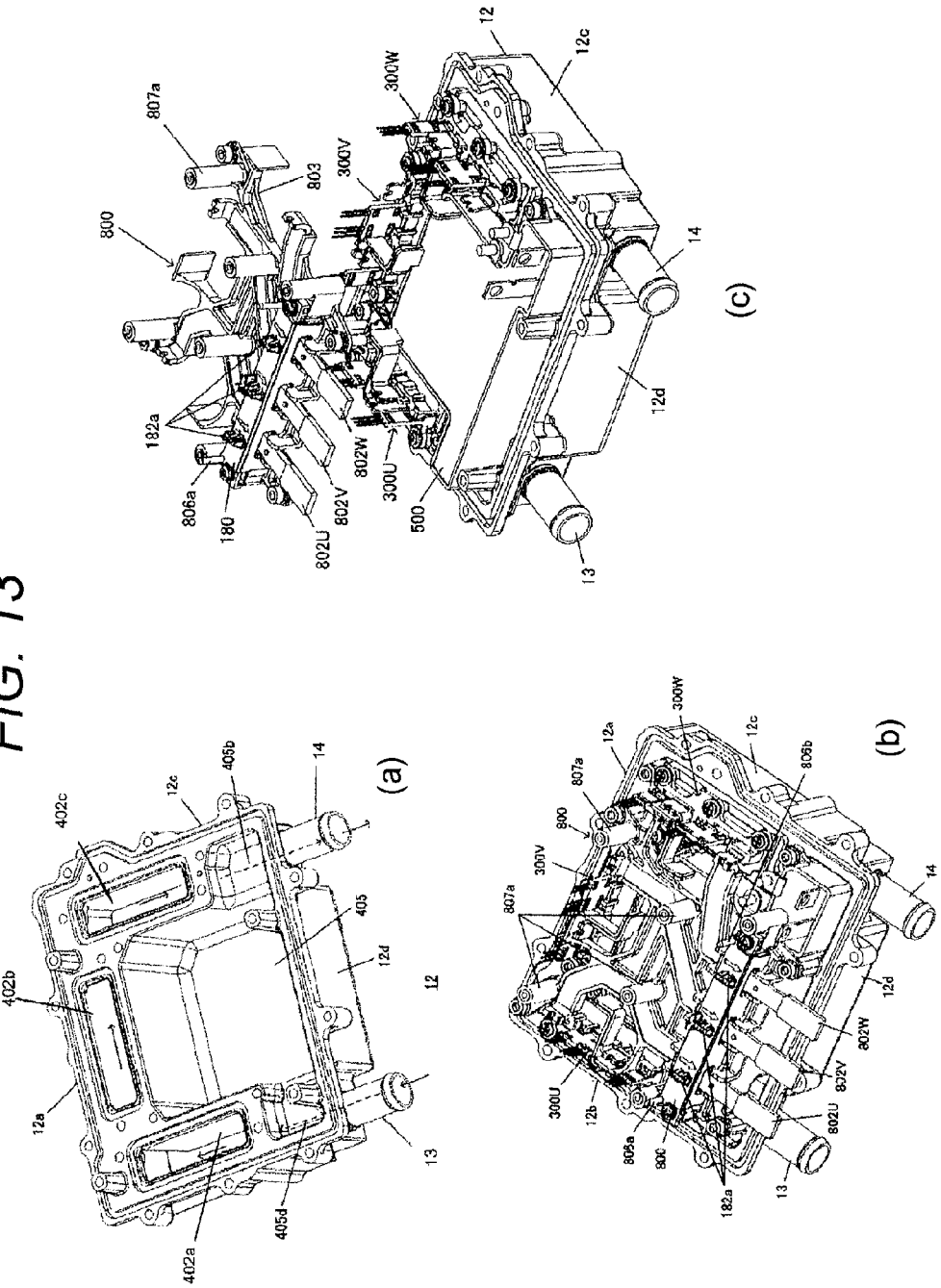
FIG. 13 is a schematic view of a power conversion device including three power modules according to the present invention, in which the power modules and the upper part of the power conversion device are removed in FIG. 13(a) so that the passage of refrigerant can be seen.

The module casing 304 is formed from a metal material having satisfactory thermal conductivity and is inserted in the refrigerant passage formed inside the power conversion device (see FIG. 13). Due to this, heat generated by the power semiconductor devices (the IGBTs 328 and 330) is dissipated from both surfaces of these power semiconductor devices to the refrigerant through the conductor plates 315, 318, 319, and 320, the insulating member (the insulating sheet 333), and the first and second heat dissipating surfaces 307A and 307B.

The first and second heat dissipating surfaces 307A and 308B and the pins 305 of the module casing 304 function as a heat dissipating plate.

On the other hand, with the storage environment and the operation of the power conversion device, the power module mounted on HEVs and EVs in particular is exposed to a large temperature change. Due to this temperature change and a difference in the thermal expansion coefficients of the materials constituting the power module, separation stress occurs in the interface between the insulating member and the semiconductor circuit portions (the IGBTs 328 and 330 and the diodes 156 and 166) including the soldering layer or the heat dissipating surfaces. That is, separation occurs in the interface between the conductor plates 315, 318, 319, and 320 and the insulating member (the insulating sheet 333) or the interface between the insulating member and the first and second heat dissipating surfaces 307A and 307B. Since these interfaces are present in the way of the passage through which heat generated by the power semiconductor devices (the IGBTs 328 and 330 and the diodes 156 and 166) is dissipated, if separation occurs in these interfaces, thermal resistance increases and heat dissipating performance deteriorates. As for the separation problem, lifespan may be designed based on a temperature environment and a separation progress speed.

However, since a surge voltage is applied between the conductor plates 315, 318, 319, and 320 and the first and second heat dissipating surfaces 307A and 307B according to the ON/OFF operation of the power semiconductor device, there is a possibility that partial discharge may occur in the separated gap. When partial discharge occurs, since the surge voltage has a high frequency, insulation deterioration quickly occurs in the insulating member (the insulating sheet 333), and the power conversion device may not be operated. Although the thickness of the insulating member (the insulating sheet 333) may be increased in order to prevent partial discharge even when separation occurs, the thermal resistance increases and the heat dissipating performance deteriorates if the insulating member (the insulating sheet 333) is made thick.

Thus, it is important to design the thickness of the insulating member to such a thickness that no discharge occurs and sufficient heat dissipating performance is obtained. Such a designing method will be described later.

Structure of Insulating Layer according to Present Invention

Here, the structure of the insulating layer according to the present invention will be described.

Figure 9:
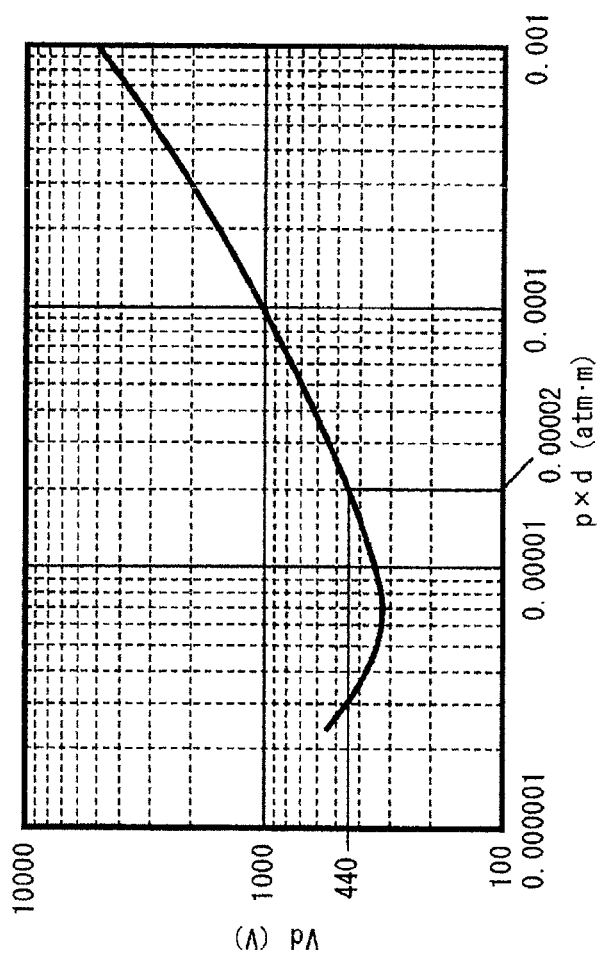
FIG. 9 is a diagram illustrating the Paschen curve for air.

FIG. 9 illustrates the Paschen curve indicating dependence on atmospheric pressure and the voltage between electrodes at which discharge occurs in the air (see Electrical Engineering Handbook (Sixth Edition): Published by the Institute of Electrical Engineers of Japan: page 523, FIG. 88 (2001)). The curve illustrated in FIG. 9 plots the product between atmospheric pressure p (atm) and a spatial distance d (m) on its horizontal axis and a discharge voltage Vd (V) on its vertical axis, and the shape of this curve is expressed by Equation (1) below.

$$Vd = A \times p \times d/(\log(p \times d) + B) \tag{1}$$

where A and B are constants.

For example, as illustrated in FIG. 9, the discharge voltage is approximately 440 V when the atmospheric pressure p=1 atm and the spatial distance d=0.00002 m=20 μm.

On the other hand, when the insulating member (the insulating sheet 333) is interposed between the conductor plates 315, 318, 319, and 320 and the first and second heat dissipating surfaces 307A and 308B, and separation occurs in one of the interfaces, it can be depicted as an electrical equivalent circuit as illustrated in FIG. 10(a).

Figure 8:
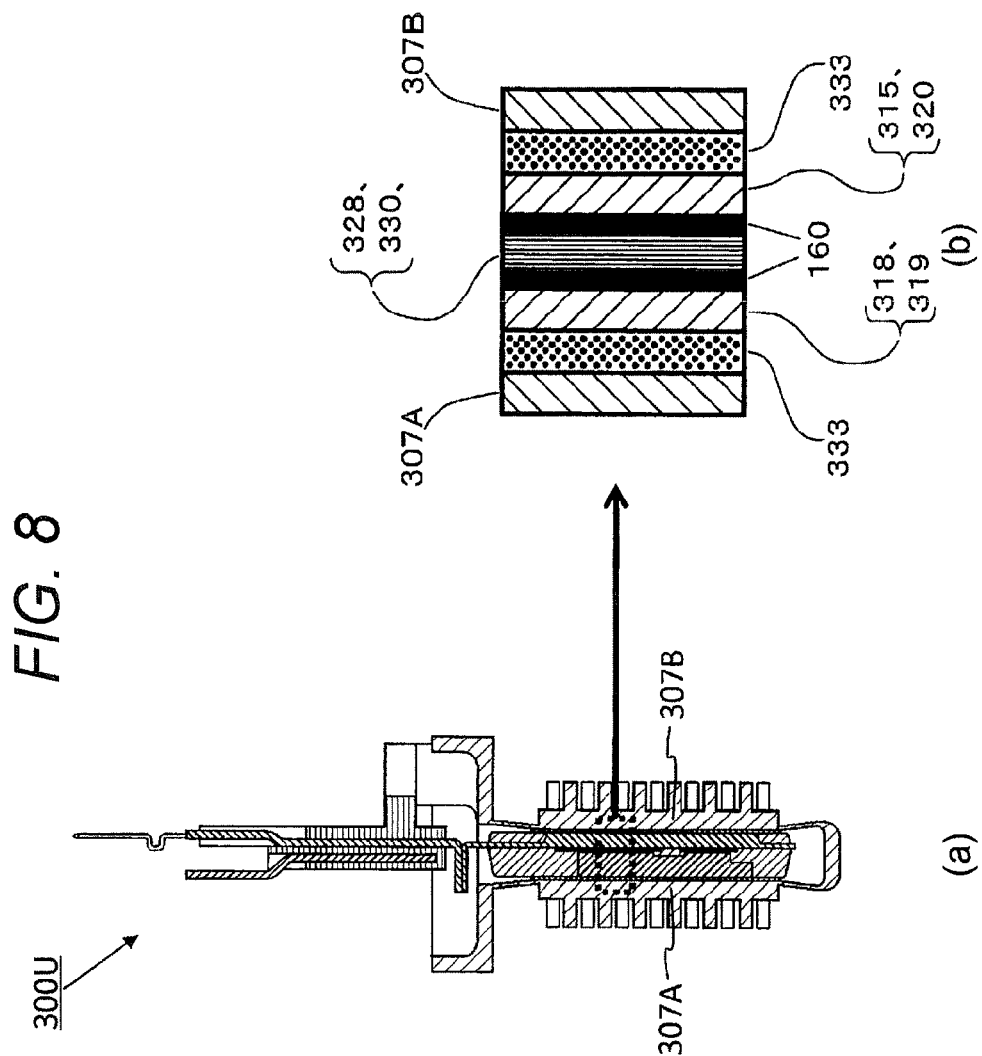
FIG. 8 is a diagram schematically illustrating a stacked structure of a portion of the power module illustrated in FIG. 4, including power semiconductor devices or diodes, in which a portion indicated by a dotted line in FIG. 8(a) is schematically illustrated in FIG. 8(b) at an enlarged scale.
Figure 10:
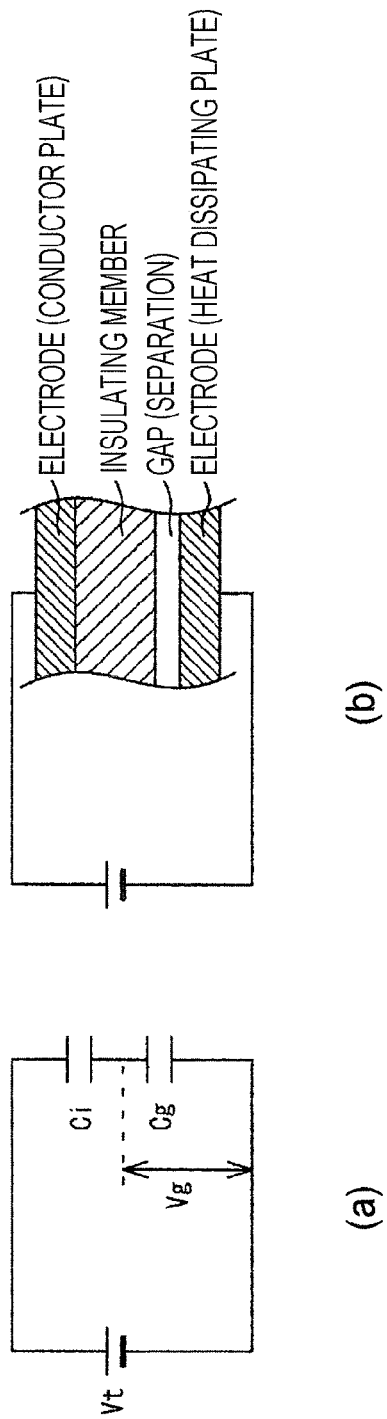

FIG. 10(b) illustrates the structure of the power module illustrated in FIG. 8, in which the thicknesses of the conductor plate, the insulating member, the gap, and the heat dissipating plate illustrated on the outer side (this figure schematically illustrates a portion of the entire figure, and the outer side corresponds to the right side of the power semiconductor device illustrated in FIG. 8(b)) of the power semiconductor device are exaggerated. Thus, the electrode (the conductor plate), the insulating member, the electrode (the heat dissipating plate) in FIG. 10 correspond to the conductor plate (318, 319, 315, and 320), the insulating sheet (333), and the heat dissipating surface (307A and 307B), respectively. Moreover, in practical conditions, since the gap is formed when the power module (300U) as illustrated in FIG. 4(b) or 8(a) is operated for a long period, the gap is not depicted in FIGS. 4(b) and 8(a).

Vt is a surge voltage (V) (this voltage is a peak value but is not an effective value) applied between the conductor plate and the heat dissipating plate, Ci is electrostatic capacitance (F) of the insulating member, Cg is electrostatic capacitance (F) of the gap, Vg is a shared voltage (V) of the gap, and Vg can be calculated by Equation (2).

$$Vg = Vt \times Ci/(Ci + Cg) \tag{2}$$

Moreover, the electrostatic capacitance C (F) of parallel flat plates can be calculated by Equation (3).

$$C = \in \times S/d \tag{3}$$

Here, $\in$ is permittivity (F/m), S is the size (m²) of the parallel flat plates, and d is the gap (m) between the parallel flat plates.

Thus, when the thickness of the insulating member is di (m), the permittivity of the insulating member is $\in_i$ (F/m), the thickness of the gap is dg (m), and the permittivity of the gap is $\in_g$ (F/m), Equation (4) can be derived from Equations (2) and (3).

$$Vg = Vt/(1 + \in_g \times di/(\in_i \times dg)) \tag{4}$$

Further, assuming that the relative permittivity of the insulating member is $\in_r$, and the inside of the gap is filled with approximately air, since the relative permittivity of the air is 1.000586≈1, Equation (4) can be modified into Equation (5).

$$Vg = Vt/(1 + di/(\in_r \times dg)) \tag{5}$$

Figure 11:
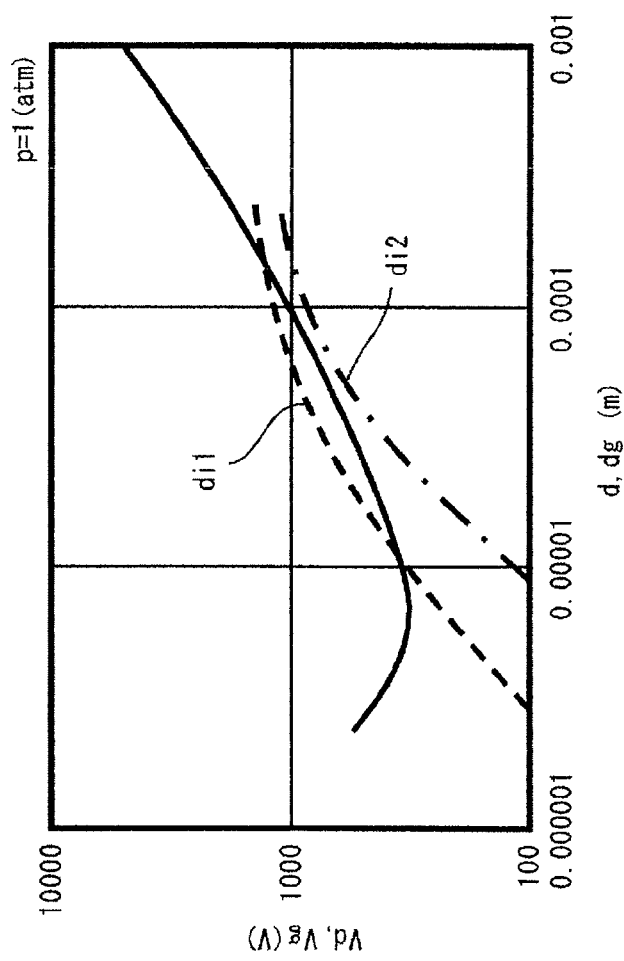
FIG. 11 is a diagram illustrating the relation between a withstanding voltage and a voltage shared by the gap based on the Paschen curve.

The partial discharge occurs when the shared voltage of the gap reaches a discharge voltage. That is, the partial discharge occurs when Vg≥Vd. FIG. 11 plots the shared voltage Vg of the gap so as to be superimposed on the Paschen curve (FIG. 9). For example, when the conductor plate and the heat dissipating plate are insulated by an insulating member having a thickness of di1 and having a certain physical property, the shared voltage of a certain surge voltage crosses the Paschen curve as indicated by a broken line in FIG. 11, and a partial discharge occurs at the gap thickness dg of approximately 0.00001 m. When the thickness of the insulating member having this physical property is increased to di2 (di2>di1), the shared voltage of the gap decreases as indicated by a one-dot chain line in FIG. 11 and does not cross the Paschen curve, and no partial discharge occurs at any thickness of the gap. That is, the thickness of the insulating member at which Vg=Vd becomes the smallest thickness at which the partial discharge occurs.

First, an approximation equation of the Paschen curve was obtained using the data disclosed in the published literature (see Electrical Engineering Handbook (Sixth Edition): Published by the Institute of Electrical Engineers of Japan: page 523, FIG. 88 (2001)).

The present inventors have tried to obtain the constants A and B using Equation (1) according to a nonlinear least-squares method but found that the constants can be satisfactorily approximated by Equation (6), in which correction terms C and D are added, as exhibited in Equation (6) below.

$$Vd = A \times (p \times d)^C/(\log(p \times d) + B)^D \tag{6}$$

Further, when the atmospheric pressure p is 1 atm and the spatial distance d is the gap thickness dg (m), Equation (6) becomes Equation (7).

$$Vd = A \times dg^C/(\log(dg) + B)^D \tag{7}$$

When the constants were approximated using Equation (7) according to a nonlinear least-squares method, the results was A=1.8×10⁷, B=5.785, C=0.9767, D=1.418.

As the nonlinear least-squares method, general methods such as the Newton method and the Marquardt method can be used.

From the above results, the thickness di of the insulating member and the thickness dg of the gap at which a relation of Vg=Vd is obtained (that is, a point where Equations (5) and (7) are equal) were calculated using Equations (5) and (7) according to the nonlinear least-squares method in the range of the surge voltages Vt from 350 V to 3000 V when the relative permittivity $\in_r$ of the insulating member is 8. Specifically, Equations (5) and (7) were differentiated by the gap thickness dg to calculate the slopes of respective equations, an objective function that minimizes the absolute value of the difference between the slopes was used, and constraint conditions that the difference between Vg and Vd becomes 0 were used.

Figure 12:
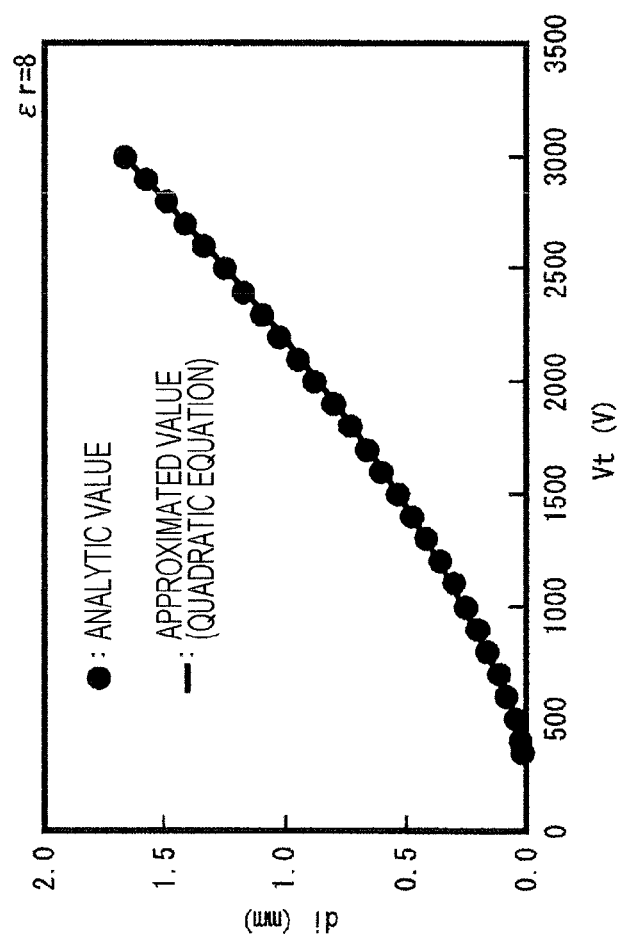
FIG. 12 is a diagram illustrating the relation between a surge voltage and the thickness of an insulating member in which partial discharge occurs.

FIG. 12 illustrates the relation between the thickness di (mm) of the insulating member and the surge voltage Vt (V). In the following description, the unit of di is millimeter (mm). Moreover, black circles in FIG. 12 are analytic values obtained by analysis. This analytic value changes continuously with the surge voltage Vt, and it was found that this change can be approximated by a quadratic equation. The following approximation equation (8) was obtained from the inverse proportional relation of the di/$\in_r$ term of equation (5).

$$di = (1.36 \times 10^{-8} \times Vt^2 + 3.4 \times 10^{-5} \times Vt - 0.015) \times \in_r \tag{8}$$

Since Equation (8) represents the marginal thickness of the insulating member at which a partial discharge occurs, Equation (9) needs to be satisfied in order to prevent a partial discharge.

$$di > (1.36 \times 10^{-8} \times Vt^2 + 3.4 \times 10^{-5} \times Vt - 0.015) \times \in_r \tag{9}$$

Equation (9) can be applied to the voids present in the interface between the insulating member and the conductor plate or the heat dissipating plate or the voids included in the insulating member. In this case, as illustrated in FIG. 10, since the equivalent circuit is the series circuit of the thickness of the insulating member and the gap, when an allowable thickness of the voids is db (mm), the thickness di (mm) of the insulating member interposed between the conductor plate and the heat dissipating plate can be expressed as Equation (10).

$$di > (1.36 \times 10^{-8} \times Vt^2 + 3.4 \times 10^{-5} \times Vt - 0.015) \times \epsilon r + db \quad (10)$$

Moreover, since the allowable thickness of the void is generally defined by the occupancy of the thickness di of the insulating member, for example, if the allowable thickness of the void is defined to be within 30% of the thickness of the insulating member, Equation (10) can be modified into Equation (11).

$$di \times (1+0.3) > (1.36 \times 10^{-8} \times Vt^2 + 3.4 \times 10^{-5} \times Vt - 0.015) \times \epsilon r \quad (11)$$

The above discussion is made for the partial discharge. In addition to this, a withstanding voltage needs to be discussed in relation to insulation reliability of the insulating member. That is, it is necessary to take the dielectric withstanding voltage (dielectric breakdown voltage) of the insulating member and the withstanding voltage required for the power conversion device into consideration.

When the dielectric withstanding voltage of the insulating member is Vbd (V/mm) and the withstanding voltage required for the power conversion device is Viso (V), Equation (12) needs to be satisfied.

$$di > Viso/Vbd \quad (12)$$

Thus, when the thickness of the insulating member is determined so that Equation 9 or Equation (10) and Equation (12) are satisfied, it is possible to provide a power conversion device having higher insulation reliability. The dielectric withstanding voltage Vbd of the insulating member and the withstanding voltage Viso required for the power conversion device need to be unified to effective values or peak values.

The description up to now is valid when the atmospheric pressure is 1 (atm). A power conversion device mounted on HEVs and EVs is also used in a high-elevation site where the elevation is over 4000 (m). The horizontal axis of the Paschen curve represents the product between the atmospheric pressure p (atm) and the spatial distance d (m). In a high-elevation site where the atmospheric pressure is low, the Paschen curve substantially shifts to the right side on the horizontal axis, and in the spatial distance on the right side of the minimum value of the Paschen curve, a discharge is more likely to occur than when the atmospheric pressure is 1 (atm).

Thus, in a power conversion device mounted on HEV, EV, and the like, the atmospheric pressure needs also to be taken into consideration. Equation (13) below is widely known as a general equation for obtaining the atmospheric pressure p (atm) at an elevation h (m) and a temperature Ta (° C.). Here, p0 (atm) is the atmospheric pressure at the sea level and can be approximated to 1 atm.

$$h = ((p0/p)^{(1/5.257)} - 1) \times (Ta + 273.15)/0.0065 \quad (13)$$

Here, when p is moved to the left side, Equation (14) is obtained.

$$p = p0/((h \times 0.0065/(Ta + 273.15)) + 1)^{5.257}) \quad (14)$$

For example, in an environment where the elevation h is 4500 (m) and the temperature Ta is −40° C., p=0.54 atm.

Thus, the insulating member may be made thicker by the amount corresponding to the decrease in the atmospheric pressure p, and Equation (15) in which the term of the atmospheric pressure p (atm) is added to Equation (9) may be used.

$$di > (1.36 \times 10^{-8} \times Vt^2 + 3.4 \times 10^{-5} \times Vt - 0.015) \times \epsilon r/p \quad (15)$$

Alternatively, Equation (16) in which the term of the atmospheric pressure p (atm) is added to Equation (10) may be used.

$$di > ((1.36 \times 10^{-8} \times Vt^2 + 3.4 \times 10^{-5} \times Vt - 0.015) \times \epsilon r + db)/p \quad (16)$$

The atmospheric pressure p (atm) is the lowest atmospheric pressure in an environment to which the power conversion device is exposed.

Moreover, various units for atmospheric pressure such as Torr, kPa, hPa, and mmHg are used, and all of these units can be used after unit conversion.

Three power modules having the above-described structure, that is, power modules 300U, 300V, and 300W for the three phases U, V, and W, were manufactured and the properties (insulating properties) were evaluated.

First Practical Example

In this practical example, the power module as illustrated in FIG. 4 was manufactured using an insulating member (a heat dissipating sheet) having a relative permittivity ∈r of 6 and a thickness d1 of 0.07 mm.

These three power modules were mounted on a water cooler, and a power conversion device as illustrated in FIG. 13 was manufactured.

FIG. 13(*a*) illustrates a passage forming structure 12 that forms the passage of refrigerant, which constitutes the lower casing of the power module. The power module illustrated in FIG. 4(*a*) is inserted in each of the openings 402*a*, 402*b*, and 402*c* of the passage forming structure 12. That is, the power modules 300U, 300V, and 300W are inserted in the openings 402*a*, 402*b*, and 402*c*, respectively. A groove to which an O-ring is attached is formed in the openings 402*a*, 402*b*, and 402*c* so that refrigerant does not leak after the power modules are inserted.

FIG. 13(*b*) is an external perspective view illustrating a state where the power modules 300U to 300W, the capacitor module 500, and a busbar assembly 800 are assembled into the passage forming structure 12. Moreover, FIG. 13(*c*) illustrates a state where the busbar assembly 800 is removed from the passage forming structure 12. The busbar assembly 800 is fixed to the passage forming structure 12 using bolts.

The power module protrudes slightly downward from the passage forming structure 12. Thus, a lower cover for sealing this protruding portion is further formed on the lower side of the passage forming structure, which is not illustrated in FIG. 13. Moreover, when this power conversion device is mounted on a vehicle, practically, a substrate having a driver circuit mounted thereon, a substrate having a control circuit mounted thereon, and an upper cover are further formed on the upper side of the capacitor module 500 and the busbar assembly 800, which are not illustrated in the figure.

As illustrated in FIG. 13, refrigerant flowing from a pipe 13 flows through the passage of the passage forming structure 12 formed in a C-shape and flows out from a pipe 14. The refrigerant flowing through the passage of the passage forming structure 12 passes through the cooling pins 305 of the power modules 300U, 300V, and 300W that are immersed in the refrigerant to thereby remove the heat generated by the IGBTs 328 and 330 of the power modules.

A 3-phase AC motor was driven with a power voltage of 420 V and a motor current of 300 (A) while allowing the refrigerant to circulate through the power conversion device of FIG. 13.

In this case, since the surge voltage Vt was 620 V, the thickness di of the heat dissipating sheet of the power module according to this practical example at which Equation (9) is satisfied is di>0.068 mm, and thus, Equation (9) is satisfied. A partial discharge test was conducted in the initial state of the power conversion device, the partial discharge voltage was 1 kV or higher.

Further, when the partial discharge test was conducted after conducting 1000 cycles of a temperature cycle test at temperatures of −40° C. to 125° C., the partial discharge voltage was 1 kV or more and did not change.

When the cross-section of the power module was observed after the temperature cycle was conducted, a gap having a thickness of approximately 20 μm was formed in a portion of the interface between the heat dissipating sheet and the heat dissipating plate.

Comparative Example

In this comparative example, power modules were manufactured by the same method as the first practical example using a heat dissipating sheet having a relative permittivity ∈r of 9 and a thickness d2 of 0.08 mm.

Similarly to the first practical example, the three power modules of this comparative example were mounted on a cooler, and a power conversion device was manufactured. A 3-phase AC motor was driven with a power voltage of 420 V and a motor current of 300 A while allowing the refrigerant to circulate through the power conversion device.

In this case, since the surge voltage Vt was 620 V, the thickness di of the heat dissipating sheet of the power module according to this comparative example at which Equation 9 is satisfied is di>0.102 mm, and thus, Equation (9) is not satisfied.

A partial discharge test was conducted in the initial state of the power conversion device, the partial discharge voltage was 1 kV or higher. Further, when the partial discharge test was conducted after conducting 1000 cycles of a temperature cycle test at temperatures of −40° C. to 125° C., the partial discharge voltage was 612 V, and thus, the partial discharge voltage deteriorated. When the cross-section of the power module was observed after the temperature cycle was conducted, a gap having a thickness of approximately 15 μm was formed in a portion of the interface between the heat dissipating sheet and the heat dissipating plate.

In this comparative example, since the partial discharge voltage is lower than the surge voltage, there is a possibility that a partial discharge may occur due to the surge voltage that is repeatedly applied during the operation of the power conversion device, and that dielectric breakdown may occur in a short period.

As described above, in the comparative example where the heat dissipating sheet is thicker than that of the practical example, it can be understood that, if Equation (9) is not satisfied, a partial discharge occurs, which results in insulation deterioration.

On the other hand, similarly to the power module disclosed in PTL 1, the power module according to the present invention has a structure in which the conductor plates 315, 318, 319, and 320 are bonded to both surfaces of the power semiconductor devices IGBTs 328 and 330 with the solder layer 160 interposed, and insulation and heat dissipation of the heat dissipating surfaces on the outer side of these conductor plates, and the first and second heat dissipating surfaces 307A and 307B are realized by the insulating member (the insulating sheet 333) made from a resin.

That is, the thermal conductivity of the power semiconductor devices (the IGBTs 328 and 330 and the diodes 156 and 166), the conductor plates 315, 318, 319, and 320, the solder-ing layer 160, and the first and second heat dissipating surfaces 307A and 307B has values ranging from several tens (W/mK) to several thousands (W/mK), whereas the thermal conductivity of the insulating member (the insulating sheet 333) has values ranging from several to 10 (W/mK) at most, which is worse by 1 to 2 digits than the former thermal conductivity. That is, in the power module as illustrated in FIG. 4 in which insulation is realized by the insulating member (the insulating sheet 333) made from a resin and heat is dissipated from both surfaces, the proportion of the thermal resistance of the insulating member to the thermal resistance of the entire power module is high. Moreover, when the conductor plates 315, 318, 319, and 320 and the first and second heat dissipating surfaces 307A and 307B are members made from copper, aluminum, or the like, the proportion is approximately 30(%) even when the sizes of the power semiconductor devices (the IGBTs 328 and 330 and the diodes 156 and 166), the conductor plates 315, 318, 319, and 320, and the first and second heat dissipating surfaces 307A and 307B are changed. Thus, the thickness of the insulating member (the insulating sheet 333) cannot be freely increased.

In contrast, it is known that sufficient cooling effect is obtained if the condition of Equation (17) is satisfied when a thermal resistance from the power semiconductor device of the power module to refrigerant is Rt (K/W), the thickness of the insulating member (the insulating sheet 333) is di (mm), the thermal conductivity of the insulating member (the insulating sheet 333) is λi (W/mK), and the size of the insulating member (the insulating sheet 333) is Si (m²).

$$di \leq Rt \times 0.3 \times \lambda i \times Si \times 1000 \qquad (17)$$

As described above, according to the present invention, it is possible to determine the thickness of a heat dissipating member that secures long-term insulation reliability in a simple manner while maintaining high heat dissipating properties in an insulating structure in which two conductive members (in this example, any one of the conductor plates 315, 318, 319, and 320 and any one of the first and second heat dissipating surfaces 307A and 307B) are insulated by the insulating member (the insulating sheet 333) made from a resin, in particular, a power conversion device in which a main circuit (the series circuit 150) of the power module and a cooler or a housing of the power conversion device are electrically isolated by the insulating member (the insulating sheet 333) made from a resin. Moreover, according to the present invention, it is possible to secure insulation reliability over a long period without internal maintenance in a power conversion device which is used in a strict environment such as HEVs and EVs.

In this practical example, although a power module having such a structure that the power module is cooled from both surfaces is used, the present invention is not limited to this structure. For example, the present invention can be applied to an electrical insulating structure between a lead frame of a sealing module, in which a chip is die-attached to the lead frame, and a cooler or a heat sink, an insulating structure between coils of a motor, and the like.

That is, in an insulating structure in which two conductive members are insulated by the insulating member (the insulating sheet 333) made from a resin, it is possible to minimize the thickness of the insulating member (the insulating sheet 333) where a partial discharge does not occur even when voids are present.

Further, by using the largest value of the values measured within the range including the frequencies of the applied surge voltage as the relative permittivity of the insulating member (the insulating sheet 333), or using the largest values among the values measured before and after durability deterioration occurs as the relative permittivity of the insulating member (the insulating sheet 333) since the relative permittivity changes when the insulating member (the insulating sheet 333) absorbs moisture, it is possible to further improve the insulation reliability.

Moreover, a member in which inorganic fillers such as silica, alumina, or silicon nitrides having high thermal conductivity are filled in an insulating resin material such as acryl, epoxy, or polyimide by an amount corresponding to 30 to 90 (in a volume %) is used as the insulating member (the insulating sheet 333). Among inorganic fillers, by filling boron nitrides having relatively low relative permittivity and high thermal conductivity, it is possible to decrease the relative permittivity of the entire insulating member. Moreover, by filling aluminum nitrides having relatively high relative permittivity and further higher thermal conductivity, it is possible to increase the thermal conductivity of the entire insulating member and to improve heat dissipating properties. Further, by filling boron nitrides, aluminum nitrides, or the like in insulating resin materials such as polyimide or polyamide imide having relatively low relative permittivity among the insulating resin materials, it is possible to improve heat dissipating properties. If the same insulation reliability is obtained, since the thickness of the insulating member can be decreased and the thermal resistance can be decreased by using the insulating member having low relative permittivity, it is possible to obtain higher cooling performance. Thus, it is advantageous to use boron nitrides and polyimide or polyamide imide having low relative permittivity as the insulating member.

The present invention is not limited to the above embodiment. Various modifications can be made without impairing the features of the present invention.

For example, although it has been described that the series circuit 150 for one phase, that is, the IGBTs 328 and 330 and the diodes 156 and 166 each are provided for each power module, the present invention can be similarly applied to a power module in which series circuits for three phases are provided in one power module.

The content disclosed in the following prior application is incorporated herein by reference:

Japanese Patent Application No. 2010-288240 (filed on Dec. 24, 2010)

The invention claimed is:

1. A power module comprising:
a power semiconductor device;
a first conductive member that is fixed to the power semiconductor device by a metal bonding member; and
a second conductive member that is bonded to the first conductive member by an insulating sheet made from a resin, the insulating sheet being bonded to the first and second conductive members by thermocompression bonding, wherein
when a thickness of the insulating sheet is di (mm), a relative permittivity of the insulating sheet is $\in r$, and a surge voltage generated between the conductive members is Vt (V), di and $\in r$ are set for Vt so as to satisfy a relation of $di > (1.36 \times 10^{-8} \times Vt^2 + 3.4 \times 10^{-5} \times Vt - 0.015) \times \in r$, and
when an insulating layer and an air layer are present in series in an equivalent circuit between the first and second conductive members, a discharge is suppressed.

2. A power module comprising:
a power semiconductor device;
a first conductive member that is fixed to the power semiconductor device by a metal bonding member; and
a second conductive member that is bonded to the first conductive member by an insulating sheet made from a resin, the insulating sheet being bonded to the first and second conductive members by thermocompression bonding, wherein
when a thickness of the insulating sheet is di (mm), a relative permittivity of the insulating sheet is $\in r$, a surge voltage generated between the conductive members is Vt (V), and a lowest atmospheric pressure to which the power module is exposed is p (atm), di and $\in r$ are set so as to satisfy a relation of $di > (1.36 \times 10^{-8} \times Vt^2 + 3.4 \times 10^{-5} \times Vt - 0.015) \times \in r / p$, and
when an insulating layer and an air layer are present in series in an equivalent circuit between the first and second conductive members, a discharge is suppressed.

3. A power module comprising:
a power semiconductor device;
a first conductive member that is fixed to the power semiconductor device by a metal bonding member; and
a second conductive member that is bonded to the first conductive member by an insulating sheet made from a resin, the insulating sheet being bonded to the first and second conductive members by thermocompression bonding, wherein
when a thickness of the insulating sheet is di (mm), a relative permittivity of the insulating sheet is $\in r$, a surge voltage generated between the conductive members is Vt (V), and an allowable thickness of any one of voids present in an interface between the insulating sheet and the conductive member and voids included in the insulating sheet is db (mm), di and $\in r$ are set so as to satisfy a relation of $di > (1.36 \times 10^{-8} \times Vt^2 + 3.4 \times 10^{-5} \times Vt - 0.015) \times \in r + db$, and
when an insulating layer and an air layer are present in series in an equivalent circuit between the first and second conductive members, a discharge is suppressed.

4. A power module comprising:
a power semiconductor device;
a first conductive member that is fixed to the power semiconductor device by a metal bonding member; and
a second conductive member that is bonded to the first conductive member by an insulating sheet made from a resin, the insulating sheet being bonded to the first and second conductive members by thermocompression bonding, wherein
when a thickness of the insulating sheet is di (mm), a relative permittivity of the insulating sheet is $\in r$, a surge voltage generated between the conductive members is Vt (V), an allowable thickness of any one of voids present in an interface between the insulating sheet and the conductive member and voids included in the insulating sheet is db (mm), and a lowest atmospheric pressure to which the power module is exposed is p (atm), di and $\in r$ are set so as to satisfy a relation of $di > ((1.36 \times 10^{-8} \times Vt^2 + 3.4 \times 10^{-5} \times Vt - 0.015) \times \in r + db) / p$, and
when an insulating layer and an air layer are present in series in an equivalent circuit between the first and second conductive members, a discharge is suppressed.

5. The power module according to claim 1, wherein
when a dielectric withstanding voltage of the insulating sheet is Vbd (V/mm), and a withstanding voltage required between the first and second conductive members is Viso (V), a relation of $di > Viso / Vbd$ is further satisfied.

6. The power module according to claim 1, wherein
the power semiconductor device includes a first principal surface and a second principal surface that face each other,
at least a first principal electrode and a plurality of control terminals are formed on the first principal surface, and a second principal electrode is formed on the second principal surface,
the first conductive member is a first conductor plate that is electrically connected to the second principal electrode of the power semiconductor device by a metal bonding member,
the power semiconductor device and the conductor plate are sealed by an insulating resin so that at least a portion of a surface opposite to a surface of the first conductor plate to which the power semiconductor device is bonded is exposed as a heat dissipating surface, and
the second conductive member is a first heat dissipating plate that is thermocompression-bonded to the heat dissipating surface by the insulating sheet.

7. The power module according to claim 6, wherein
the second conductor plate is electrically connected to the first principal electrode of the power semiconductor device by the metal bonding member,
the power semiconductor device and the second conductor plate are sealed by the insulating resin together with the first conductor plate so that at least a portion of a surface opposite to a surface of the second conductor plate to which the power semiconductor device is bonded is exposed as a second heat dissipating surface of the second conductor plate, and
the second heat dissipating plate is bonded to the second heat dissipating surface of the second conductor plate by an insulating sheet made from a resin, and the insulating sheet is thermocompression-bonded and has a thickness and a relative permittivity that are defined to be the same as those of the insulating sheet between the first heat dissipating plate and the first conductor plate.

8. The power module according to claim 6, wherein
when a thermal resistance of the power module is Rt (K/W), a thermal conductivity of the insulating sheet is $\lambda i$ (W/mK), and a size of the insulating sheet is Si (m$^2$), a relation of $di \leq Rt \times 0.3 \times \lambda i \times Si \times 1000$ is further satisfied.

9. The power module according to claim 2, wherein
the thickness di of the insulating sheet is set such that the lowest atmospheric pressure p (atm) is calculated as p=0.54 atm at an elevation of 4500 m, whereby a discharge between the first and second conductive members is suppressed.

10. The power module according to claim 4, wherein
the thickness di of the insulating sheet is set such that the lowest atmospheric pressure p (atm) is calculated as p=0.54 atm at an elevation of 4500 m, whereby a discharge between the first and second conductive members is suppressed.

11. A power conversion device for converting a DC power into an AC power, comprising an inverter on which the power module according to claim 1 is mounted.

12. The power module according to claim 7, wherein
when a thermal resistance of the power module is Rt (K/W), a thermal conductivity of the insulating sheet is $\lambda i$ (W/mK), and a size of the insulating sheet is Si (m$^2$), a relation of $di \leq Rt \times 0.3 \times \lambda i \times Si \times 1000$ is further satisfied.

* * * * *